(12) United States Patent
Lee et al.

(10) Patent No.: US 10,867,850 B2
(45) Date of Patent: Dec. 15, 2020

(54) SELECTIVE DEPOSITION METHOD FOR FORMING SEMICONDUCTOR STRUCTURE

(71) Applicant: TAIWAN SEMICONDUCTOR MANUFACTURING CO., LTD., Hsinchu (TW)

(72) Inventors: Cheng-Chin Lee, Taipei (TW); Shao-Kuan Lee, Kaohsiung (TW); Hsin-Yen Huang, New Taipei (TW); Hai-Ching Chen, Hsinchu (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 119 days.

(21) Appl. No.: 16/035,455

(22) Filed: Jul. 13, 2018

(65) Prior Publication Data

US 2020/0020580 A1    Jan. 16, 2020

(51) Int. Cl.
*H01L 21/4763* (2006.01)
*H01L 21/44* (2006.01)
(Continued)

(52) U.S. Cl.
CPC .... *H01L 21/76877* (2013.01); *H01L 21/0206* (2013.01); *H01L 21/02118* (2013.01);
(Continued)

(58) Field of Classification Search
CPC ........... H01L 21/0206; H01L 21/02118; H01L 21/02282; H01L 21/02318; H01L 21/31053; H01L 21/31111; H01L 21/76802; H01L 21/76834; H01L 23/52; H01L 2224/1405; H01L 2224/14051; H01L 2224/141; H01L 2224/1605; H01L 2224/161; H01L 2224/2505; H01L 2224/2901; H01L 2224/3005; H01L 2224/301; H01L 2224/3205; H01L 2224/321; H01L 2224/3305; H01L 2224/331; H01L 2224/4005; H01L 2224/401
(Continued)

(56) References Cited

U.S. PATENT DOCUMENTS

| 2013/0217238 A1* | 8/2013 | Boussie | H01L 21/76834 438/761 |
| 2015/0056813 A1* | 2/2015 | Huang | H01L 21/0338 438/703 |
| 2018/0034438 A1* | 2/2018 | Ryder | G01N 29/036 |

* cited by examiner

*Primary Examiner* — Kimberly N Rizkallah
*Assistant Examiner* — Dilinh P Nguyen
(74) *Attorney, Agent, or Firm* — Maschoff Brennan

(57) ABSTRACT

A method for forming a semiconductor structure is provided. A substrate including a metal portion and a low-k dielectric portion formed thereon is provided. The metal portion adjoins the low-k dielectric portion. A SAM solution is prepared. The SAM solution includes at least one blocking compound and a multi-solvent system. The multi-solvent system includes an alcohol and an ester. The SAM solution is applied over surfaces of the metal portion and the low-k dielectric portion. The substrate is heated to remove the multi-solvent system of the SAM solution to form a blocking layer on one of the metal portion and the low-k dielectric portion. A material layer is selectively deposited on the other one of the metal portion and the low-k dielectric portion using the blocking layer as a stencil. The blocking layer is removed from the substrate.

20 Claims, 32 Drawing Sheets

(51) Int. Cl.
  *H01L 21/768*     (2006.01)
  *H01L 21/02*      (2006.01)
  *H01L 21/311*     (2006.01)
  *H01L 21/3105*    (2006.01)

(52) U.S. Cl.
  CPC .. *H01L 21/02282* (2013.01); *H01L 21/02318* (2013.01); *H01L 21/31053* (2013.01); *H01L 21/31111* (2013.01); *H01L 21/76802* (2013.01); *H01L 21/76834* (2013.01)

(58) Field of Classification Search
  USPC ................................................ 438/618, 666
  See application file for complete search history.

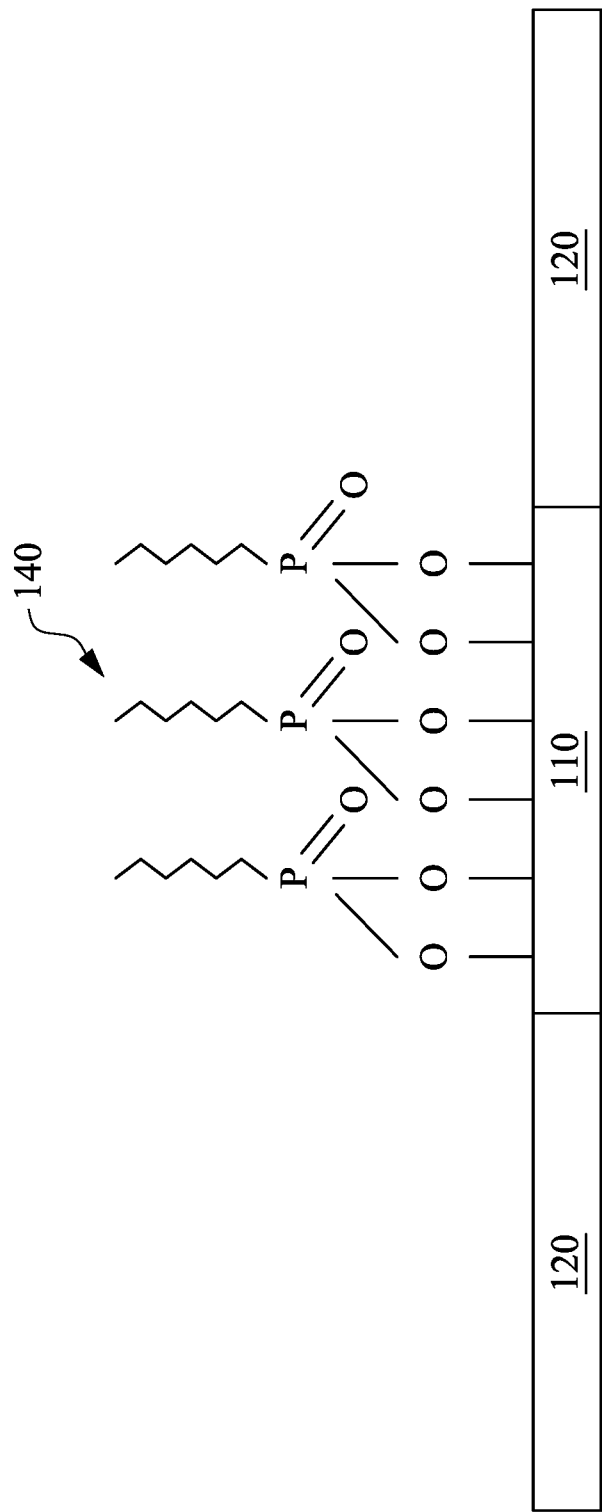

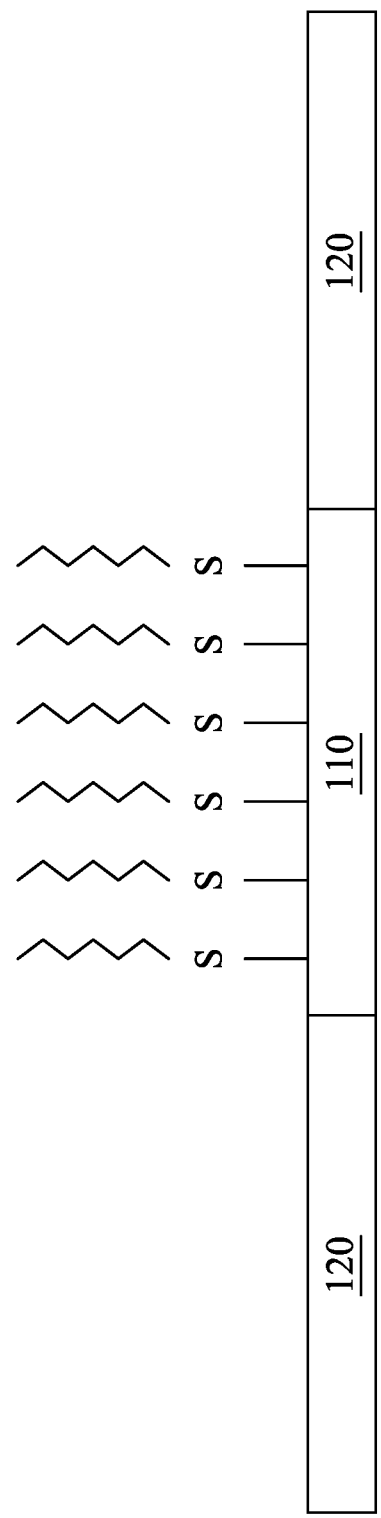

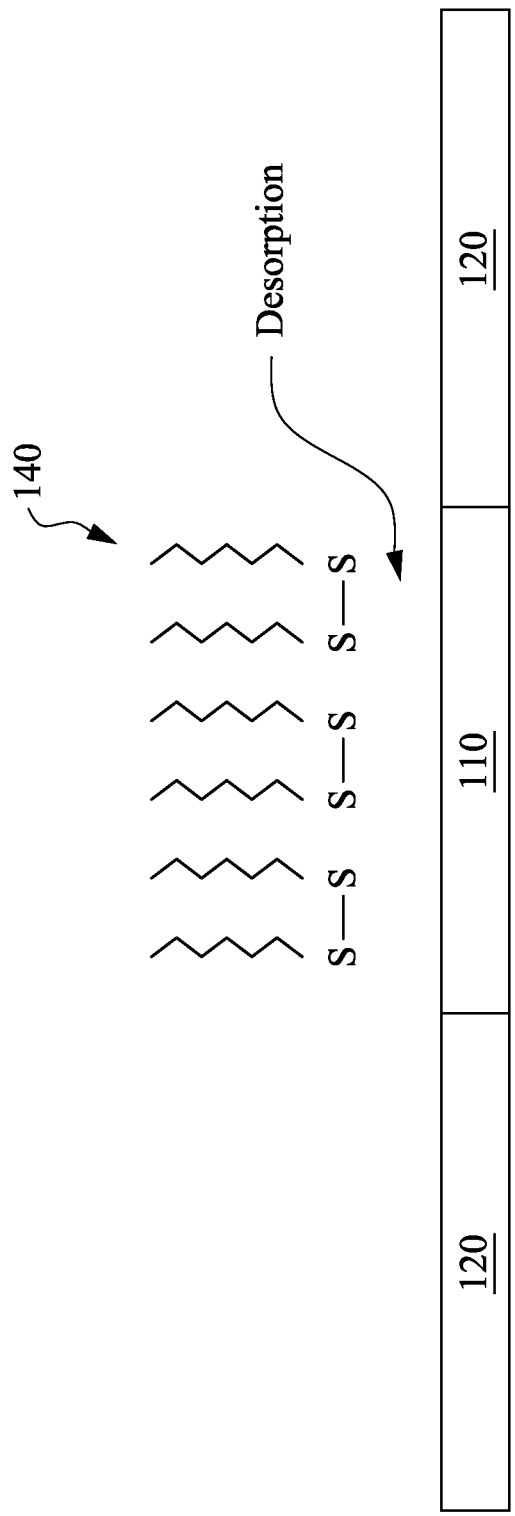

SELECTIVE DEPOSITION METHOD FOR FORMING SEMICONDUCTOR STRUCTURE

BACKGROUND

An integrated chip may contain millions of semiconductor devices. The semiconductor devices are electrically interconnected by way of back-end-of-the-line (BEOL) metal interconnect layers that are formed above the devices on an integrated chip. A typical integrated chip includes plural back-end-of-the-line metal interconnect layers including different sized metal wires vertically coupled together with metal contacts (i.e., vias).

The process of fabrication the BEOL metal interconnect layers (or structure) may include deposition of a dielectric layer, etching the dielectric layer to form an opening in the dielectric layer, filling the opening with a conductive material or other operations. Among these operations, a selective deposition process may be performed to simplify the process the fabrication of the BEOL structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1F through FIG. 1K are enlarged views of surfaces of a metal portion and a low-k dielectric portion for showing mechanisms of a pre-clean operation and operations of forming and removing a blocking layer.

DETAILED DESCRIPTION

Figure 1A:
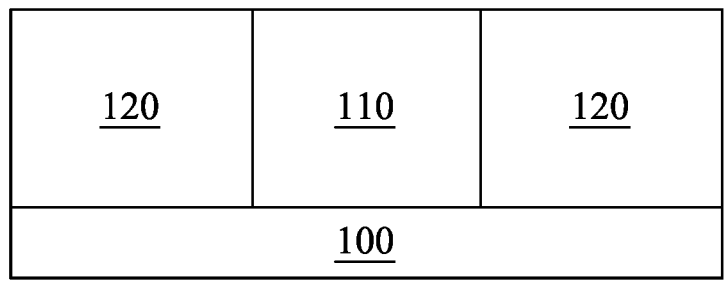
FIG. 1A through FIG. 1E are schematic cross-sectional views of intermediate stages for performing a selective deposition method in formation of a semiconductor structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Selective deposition is used to deposit a material layer on one of two layer portions of a substrate without being deposited on the other one of the two layer portions. Generally, the selective deposition may include one or more selective deposition operations, in which one of the selective deposition operations is performed to form a blocking layer, followed by the other one of the selective deposition operations performed to form the material layer. The blocking layer is formed on one of the layer portions for preventing the material layer from being deposited on the one of the layer portions, thereby selectively depositing the material layer on the other one of the layer portions that is not covered by the blocking layer. The blocking layer includes at least one blocking compound having a head group and a tail group adjoining the head group, in which the head group may adhere to a surface of the one of the layer portions so as to form self-assembly monolayer (SAM, i.e. the blocking layer), and the tail group is hydrophobic and disadvantageous to the deposition of the material layer, such as atomic layer deposition (ALD) or chemical vapor deposition (CVD), thereby preventing the formation of the material layer on the one of the layer portions.

The blocking layer is formed by applying a SAM solution including the at least one blocking compound and a solvent onto surfaces of the layer portions. Physical properties (such as solubility, boiling point, viscosity or dielectric constant (k)) of the solvent play an important role for the deposition of the blocking layer, such as a dielectric constant of the solvent. When the dielectric constant of the solvent too large, the head group of the blocking compound is orientated toward the solvent rather than concentrated on (or adhered to) on a target layer portion, thus leading to a poor coverage of the blocking layer. For example, ethanol has a large dielectric constant, and thus is not suitable for use as the solvent. On the other hand, when the dielectric constant of the solvent too small, the SAM solution may have a poor selectivity, thus causing the blocking layer to be formed on an unexpected layer portion. For example, tetrahydrofuran (THF) has a small dielectric constant, and is not suitable for use as the solvent. In addition, solubility of the blocking compound may not be sufficient in a single solvent, the single solvent is not applicable to dissolving various blocking compounds, thus increasing the complexity of preparing the SAM solution.

Embodiments of the present disclosure are directed to providing a selective deposition method for forming a semiconductor structure, such as an interconnect structure, by applying a SAM solution. The selective deposition method mainly includes selectively depositing a blocking layer on one layer portion on which a material layer is not desired to be formed by applying the SAM solution, and selectively depositing the material layer on the other layer portion using the blocking layer as a stencil.

Hereinafter, the preparation of the SAM solution is described. The SAM solution includes at least one blocking compound and a multi-solvent system. The at least one blocking compound includes a silane compound, or one or both of a thiol compound and a phosphonic acid compound, and a chemical structure of the at least one blocking compound has a head group and a tail group adjoining the head group. In some embodiments, the tail group of the at least one blocking compound includes an alkyl chain having 10 to 18 carbon atoms. In some embodiments, the head group of the silane compound includes trichlorosilicon ($SiCl_3$) or trimethoxysilane ($Si(OCH_3)_3$). In some embodiments, the head group of the thiol compound includes thiol, and the head group of the phosphonic acid compound includes phosphonic acid. In one example, the phosphonic acid compound is octadecylphosphonic acid (ODPA).

The multi-solvent system includes an alcohol and an ester, in which the alcohol has 1 to 6 carbon atoms and the ester has 1 to 6 carbon atoms. In some embodiments, the multi-solvent system includes substantially 10 weight percent (wt. %) to 90 wt. % of the alcohol and substantially 10 wt. % to 90 wt. % of the ester. In some embodiments, the multi-solvent system includes substantially 60 weight percent (wt. %) to 90 wt. % of the alcohol and substantially 10 wt. % to 40 wt. % of the ester. The amount of the alcohol and the ester of the multi-solvent system may be adjusted according to the solubility of the blocking compound. In some embodiments, the at least one blocking compound is dispersed in the multi-solvent system including an alcohol comprising glycol ether and an ester comprising glycol ether ester. In some embodiments, the multi-solvent system includes an alcohol comprising propylene glycol monomethyl ether (PGME) and an ester comprising propylene glycol monomethyl ether acetate (PGMEA). In the embodiments, the multi-solvent system is composed of PGME and PGMEA. When the amount of PGME in the multi-solvent system is greater than 90 wt. %, the solubility of the at least one blocking compound is insufficient. On the other hand, when the amount of PGMEA in the multi-solvent system is greater than 90 wt. %, a metal layer portion on the substrate on which the SAM solution is applied may be etched because PGMEA is easily hydrolyzed into acetic acid. In certain embodiments, the multi-solvent system comprises PGME in a range from about 90 wt. % to about 10 wt. % and comprises PGMEA in a range from about 90 wt. % to about 10 wt. %. In certain embodiments, the multi-solvent system comprises PGME in a range from about 90 wt. % to about 60 wt. % and comprises PGMEA in a range from about 40 wt. % to about 10 wt. %. In one example, the multi-solvent system is composed of 70 wt. % PGME and 30 wt. % PGMEA. In another example, the multi-solvent system is composed of 50 wt. % PGME and 50 wt. % PGMEA. In a further example, the multi-solvent system is composed of 30 wt. % PGME and 70 wt. % PGMEA. The coverage and the selectivity of the blocking layer may be further improved when the multi-solvent system is composed of 70 wt. % PGME and 30 wt. % PGMEA. In some embodiments, PGME and PGMEA are miscible with each other.

In some embodiments, the multi-solvent system has a dielectric constant that is smaller than a dielectric constant of ethanol and greater than a dielectric constant of tetrahydrofuran. In some embodiments, the multi-solvent system has a dielectric constant that is in a range substantially from 10 to 12 (i.e., the mixture of multi-solvent system together has a dielectric constant in the range from about 10 to about 12). In some embodiments, a concentration of the at least one blocking compound in the SAM solution is in a range substantially from 1 mM to 5 mM. When the concentration of the blocking compound is smaller than 1 mM, the coverage of the blocking layer on the layer portion would not be sufficient; and when the concentration of the blocking compound is greater than 5 mM, the blocking compound may be aggregated, and the selectivity of deposition of the blocking layer may decrease. In some embodiments, the SAM solution may further include an additive, such as a stabilizer, a surfactant or a dispersant.

The multi-solvent system of the SAM solution of the present disclosure is able to affect the direction of a head group of the blocking compound, and enables the blocking compound to be concentrated on the target layer portion surface rather than to be orientated toward the multi-solvent system, thereby forming the blocking layer sufficiently covering the target layer portion to prevent the material layer from being deposited thereon. Advantages of the multi-solvent system of the present disclosure include having less odor, containing no carcinogenic, mutagenic or toxic for reproduction (CMR) substances, low cost, and having a high flash point, and thus the multi-solvent system is relatively friendly to environment, safe, less harmful to human health, and easily applied in a chemical scale-up process. Further, the multi-solvent system of the SAM solution of the present disclosure is compatible (i.e., has good solubility, dispersity or the like) with a variety of the blocking compounds or even with other additives, and thus the SAM solution is applicable to various semiconductor fabrication processes, for example, to selective deposition of a dielectric layer on a low-k dielectric layer (DoD), selective deposition of a dielectric layer on a metal layer (DoM) and/or selective deposition of one metal layer on another metal layer (MoM).

FIG. 1A through FIG. 1E are schematic cross-sectional views of intermediate stages for performing a selective deposition method in formation of a semiconductor structure. FIG. 1F through FIG. 1K are enlarged views of surfaces of a metal portion and a low-k dielectric portion for showing mechanisms of a pre-clean operation and operations of forming and removing a blocking layer. As shown in FIG. 1A, a substrate 100 is provided. The substrate 100 may include a semiconductor substrate including any type of semiconductor body (e.g., silicon, SiGe, SOI) such as a semiconductor wafer and/or one or more die on a wafer, as well as any other type of semiconductor and/or epitaxial layers associated therewith. In some embodiments, the semiconductor substrate 100 includes a silicon starting material, such as a single-crystal silicon with a <100> orientation. In other embodiments, the semiconductor substrate 100 may include an epitaxial layer grown on the surface of the substrate 100. The substrate 100 may also include other conductive, insulative and semiconductive portions. For example, the substrate 100 includes shallow trench isolations and various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 100 may further include other functional features such as a resistor or a capacitor formed in and on the substrate 100. A metal portion 110 and a low-k dielectric portion 120 are formed on the substrate 100. The metal portion 110 adjoins the low-k dielectric portion 120. In some embodiments, the metal portion 110 is peripherally enclosed by the low-k dielectric portion 120, as shown in FIG. 1A. In one example, the metal portion 110 may be formed from copper. In one example, the low-k dielectric portion 120 may include carbon-doped SiO2, fluorinated silicate glass (FSG), porous silicon dioxide, porous carbon-doped silicon dioxide, spin-on organic polymeric dielectrics or spin-on silicon based polymeric dielectric.

Figure 1B:
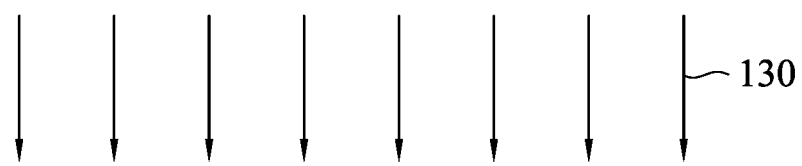
Figure 1B:
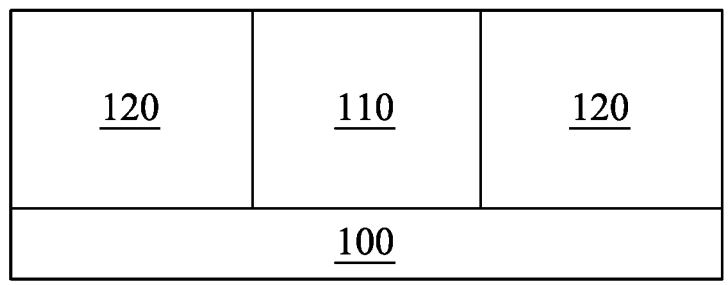

The SAM solution 130 is prepared according to the aforementioned description, in which the SAM solution 130 includes the at least one blocking compound and the multi-solvent system. The at least one blocking compound is configured to adhere to one of the metal portion 110 and the low-k dielectric portion 120. The at least one blocking compound includes a silane compound, or one or both of a thiol compound and a phosphonic acid compound. The multi-solvent system includes an alcohol having 1 to 6 carbon atoms, and an ester having 1 to 6 carbon atoms. In one example, the multi-solvent system of the SAM solution 130 may include 70 wt. % PGME and 30 wt. % PGMEA (dielectric constant k=12). In some embodiments, PGME and PGMEA are miscible with each other. Then, as shown in FIG. 1B, the SAM solution 130 is applied over surfaces of the metal portion 110 and the low-k dielectric portion 120. In some embodiments, the SAM solution 130 may be applied over the surfaces of the metal portion 110 and the low-k dielectric portion 120 by a wet operation such as immersion, spin coating, dip coating, or spraying, such that the at least one blocking compound of the SAM solution adheres to one of the metal portion 110 and the low-k dielectric portion 120.

Figure 1C:
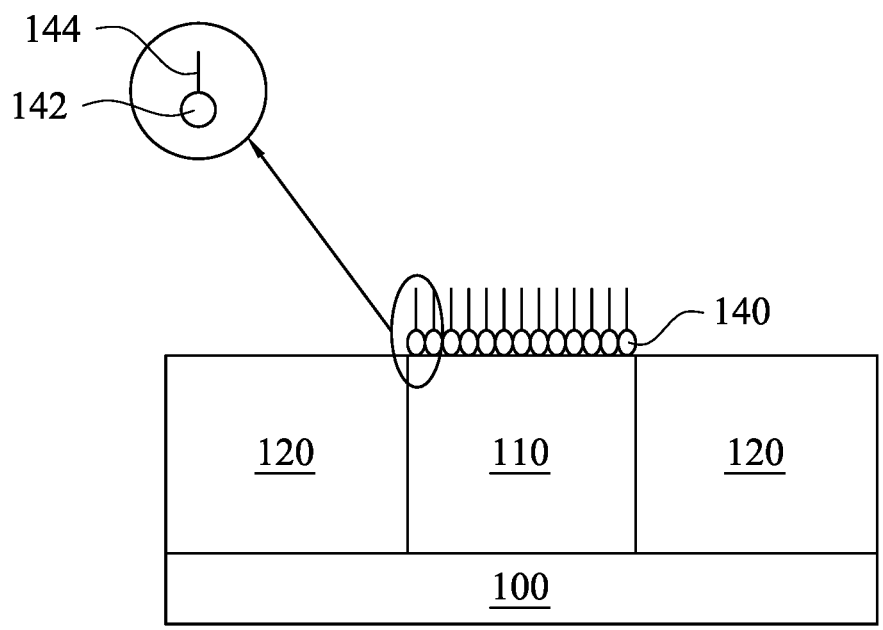
Figure 1D:
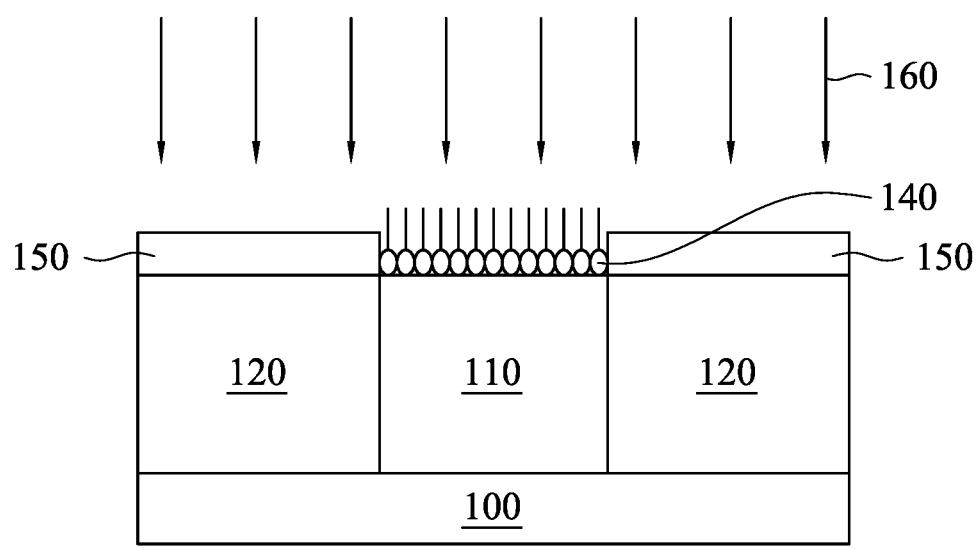
Figure 1E:
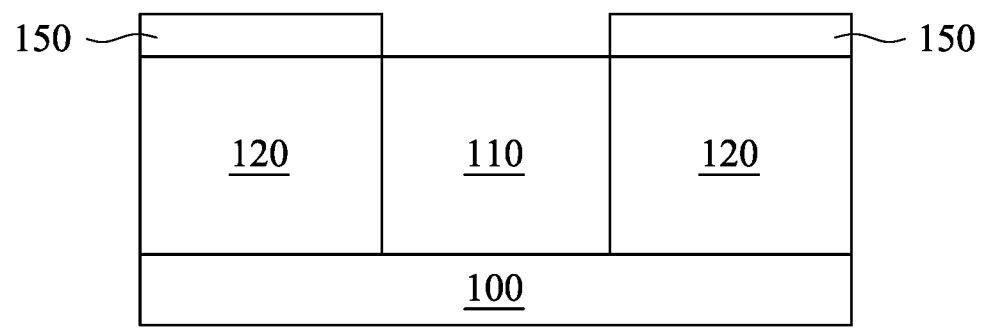
Figure 1F:
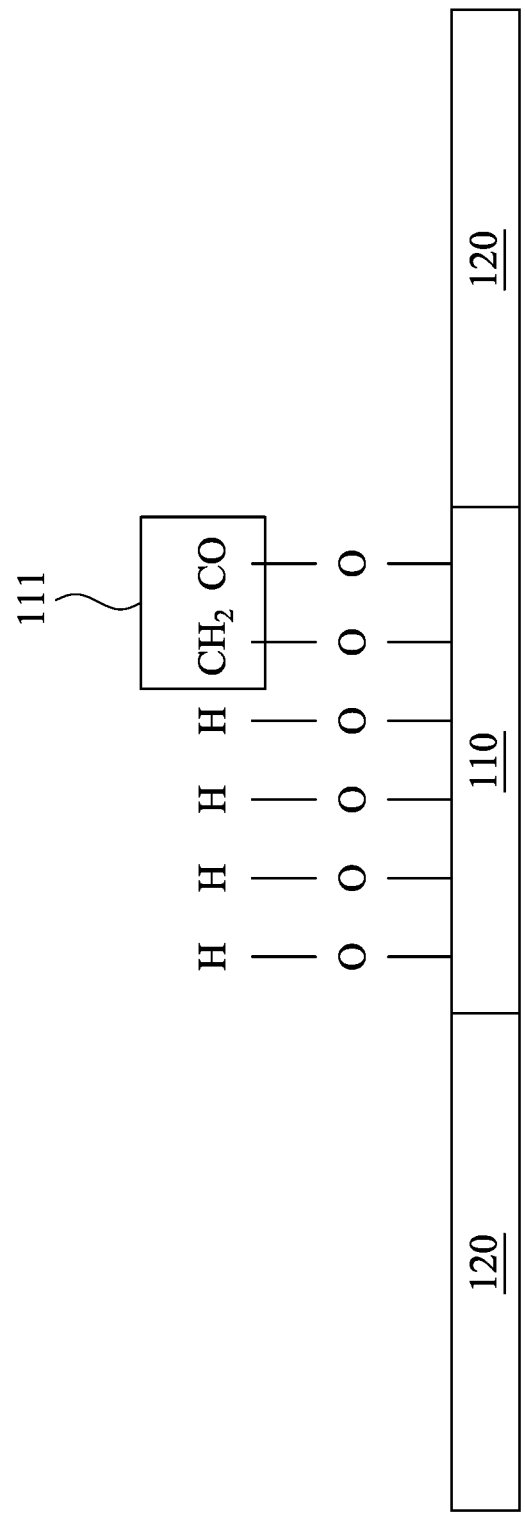
Figure 1G:
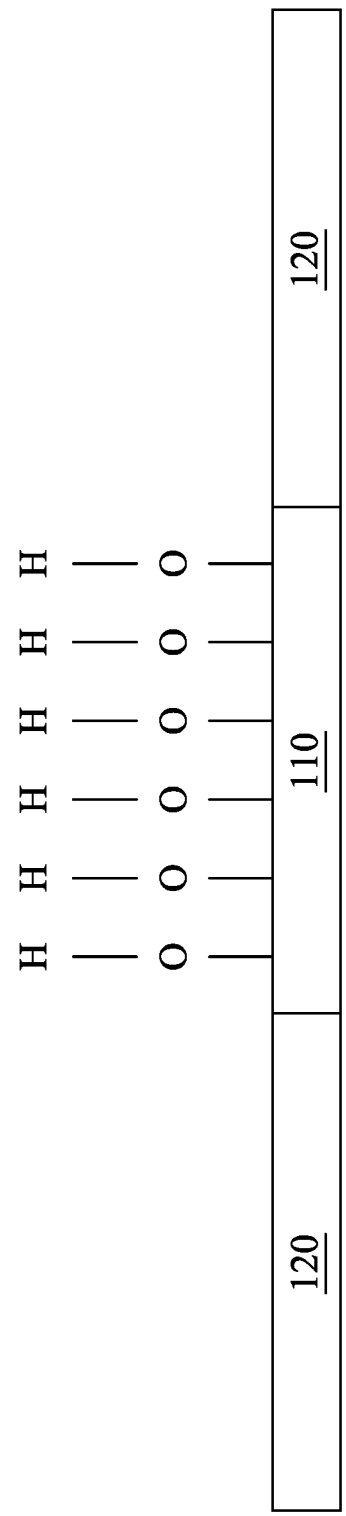

In certain embodiments, the selective deposition method may further include a pre-clean operation before applying the SAM solution 130, as shown in FIG. 1F and FIG. 1G. In some embodiments, the pre-clean operation may include an UV pre-clean operation after a chemical mechanical planarization (CMP) process on the surfaces of the metal portion 110 and the low-k dielectric portion 120, in which ozone ($O_3$) is exposed to an UV light source and is decomposed into $O_2$, O radicals, O ions. The $O_2$ and O may then react with the contamination 111 (e.g. $CH_2$ group or CO group bound to the oxygen on the surfaces of the metal portion 110) on the metal portion 110, in which the contamination 111 may come from the atmosphere. After removing the contamination 111 using the pre-clean operation, hydroxyl groups may be distributed on the surfaces of the metal portion 110, as shown in FIG. 1G. The hydroxyl groups may then be used to form a blocking layer by reacting the blocking compound in the SAM solution 130 with the hydroxyl groups.

Then, the substrate 100 is heated (e.g. about 100° C. to about 150° C.) to remove the multi-solvent system of the SAM solution 130 over the surfaces of the metal portion 110 and the low-k dielectric portion 120 to form a blocking layer 140 on one of the metal portion 110 and the low-k dielectric portion 120 (i.e. the at least one blocking compound remains as the blocking layer 140). However, when the substrate 100 is heated under a temperature greater than 150° C., the structure underlying the blocking layer 140 may be further oxidized because the blocking layer 140 has not been completely formed, in which the oxidation of the underlying structure may cause defects of the semiconductor device. When the at least one blocking compound includes one or both of the thiol compound and the phosphonic acid compound, and the blocking layer 140 is formed on the metal portion 110, as shown in FIG. 1C. In an example, the blocking molecules are ODPA. When the blocking compound includes the silane compound, the blocking layer is formed on the low-k dielectric layer 120, which is not shown in the figures, but one of ordinary skill in the art may easily understand that from FIG. 1C. In some embodiments, the vaporized multi-solvent system may be recycled and reused. In some embodiments, a washing operation may be performed to remove the residues of the at least one blocking compound on the low-k dielectric portion 120. For example, the washing operation is performed using toluene, acetone, chloroform or a combination thereof. The blocking layer 140 is a self-assembled monolayer (SAM) of the blocking compound having a head group 142 that is hydrophilic and a tail group 144 that is hydrophobic and adjoins the head group 142. The specific examples of the head group 142 and the tail group 144 are described before and may not be repeated herein. It is noted that the head group 142 of the blocking compound (the thiol compound and/or the phosphonic acid compound) only adhered to (selectively deposited on) the metal portion 110, and the tail group 144 including a highly hydrophobic and long alkyl chain blocks adsorption of a precursor for depositing a material layer 150 (shown in FIG. 1D), thereby preventing a material layer 150 from being formed on the metal portion 110. Generally, the precursor has a functional group that generates a repulsive force with the long alkyl chain of the blocking compound, so as to prevent the precursor from adsorbing on the metal portion 110. For example, the functional group may be an alkyl group. In a certain example, the precursor may be trimethylaluminum. FIG. 1H shows an embodiment where the blocking layer 140 formed by the phosphonic acid compound, and FIG. 1I shows an embodiment where the blocking layer 140 formed by the thiol compound. It is noted that the alkyl chain shown in FIG. 1H through FIG. 1K are merely shown for illustration and does not represent the exact length of the alkyl chain. In other embodiments in which the blocking compound is the silane compound, the head group of the silane compound only adheres to the low-k dielectric portion, and the tail group including a highly hydrophobic and long alkyl chain can prevent the material layer from being deposited on the low-k dielectric portion, although no figures of the present disclosure are shown for this mechanism.

Thereafter, as shown in FIG. 1D, the material layer 150 is selectively deposited on the low-k dielectric portion 120 using the blocking layer 140 as a stencil. As described previously, the blocking layer 140 is able to block the deposition of the material layer 150 on the metal portion 110, and thus lithography is not needed in embodiments of the present disclosure. In the embodiments in which the material layer 150 is deposited on the low-k dielectric portion 120, the material layer 150 may include a dielectric material (hereinafter referred to as the dielectric layer 150), and the operation shown in FIG. 1D is referred to as the DoD process since the dielectric layer 150 is deposited on another dielectric layer (i.e. the low-k dielectric layer 120). In some embodiments, the dielectric layer 150 may include aluminum oxide, cobalt oxide or zirconium oxide. In some embodiments, the dielectric layer 150 may be deposited by an atomic layer deposition (ALD) process 160. The ALD process 160 may include providing one or more cycles of pulses of two precursor separated by pulses of a purge gas/vacuum for about monolayer growth per cycle. For example, the ALD process 160 of aluminum oxide includes one or more cycles of a pulse of an aluminum precursor and a pulse of an oxygen precursor. In other embodiments, the dielectric layer 150 may be deposited by chemical vapor deposition (CVD) or any other deposition process using a precursor having the functional group that generates the repulsive force with the tail group of the blocking compound. In some embodiments, the dielectric layer 150 has a thickness substantially equal to or greater than 50 Å. In a further embodiment, the dielectric layer 150 has the thickness substantially equal to or greater than 100 Å. When the thickness of the dielectric layer 150 is smaller than 50 Å, the dielectric layer 150 is unable to provide sufficient protection to the underlying low-k dielectric layer 120. It is noted that the upper limit of the thickness of dielectric layer 150 may vary in accordance with actual requirements of a semiconductor fabrication process.

In some embodiments, when the blocking layer formed from the silane compound is formed on the low-k dielectric portion, the material layer may be deposited on the metal portion, the material layer may be formed from the dielectric material or a metal material. The operation of forming the material layer from the metal material and on the metal portion may be referred to as a MoM process, in which the metal material may be any common metal material used to form contacts or other features. The operation of forming the material layer from the dielectric material and on the metal portion may be referred to as a DoM process, in which the dielectric material may be similar to the dielectric layer 150. In some embodiments, the silane compound is suitable for forming the blocking layer on a SiCOH (organo-silicate glass, OSG) substrate.

Figure 1J:
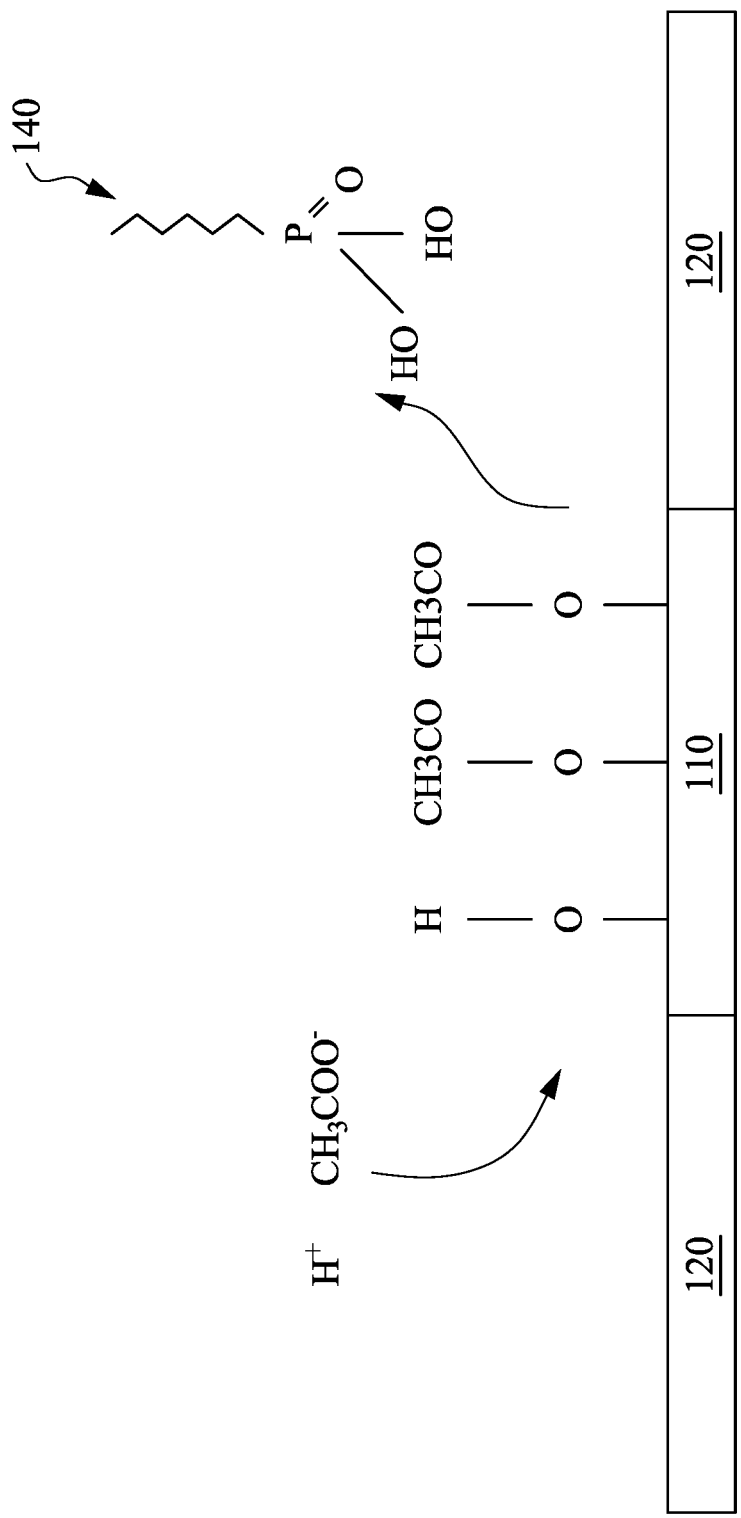

Thereafter, as shown in FIG. 1E, the blocking layer 140 is removed from the substrate 100. During removal of the blocking layer 140, the dielectric layer 150 may protect the underlying low-k dielectric portion 120 from being damaged. When the blocking layer 140 of the phosphonic acid compound (e.g. ODPA) is formed on the metal portion 110, the blocking layer 140 may be removed by applying acetic acid over the blocking layer 140 and the dielectric layer 150, as shown in FIG. 1J. Alternatively, when the blocking layer 140 of the thiol compound is formed on the metal portion 110, the blocking layer 140 may be removed by heating (e.g. greater than about 100° C. to about 150° C.) the substrate 100, as shown in FIG. 1K. In the embodiments where the phosphonic acid compound and the thiol compound are involved in the SAM solution 130, the above two removal operations may be both performed. In other embodiments, when the blocking layer formed from the silane compound is formed on the low-k dielectric portion, the blocking layer 140 may be removed by being exposed to an UV light.

After the blocking layer 140 is removed, a ratio of an aluminum content and a copper content (Al/Cu ratio) on the surface of the metal portion 110 is measured to check the degree of protection of the blocking layer 140. In this example, the metal portion 110 includes copper and the material layer 150 includes aluminum oxide, and thus the Al/Cu ratio on the surface of the metal portion 110 is small. Therefore, less Al/Cu ratio over the metal portion 110 means that the SAM/ALD process provides higher deposition selectivity over the low-k dielectric portion 120. In other words, the smaller Al/Cu ratio means less dielectric layer 150 formed on the metal portion 110, and represents the better protection of the blocking layer 140 provided to the metal portion 110. Referring to Table 1, Table 1 shows Al/Cu ratio results for various examples, in which Example 1 is a contrast example in which the dielectric layer 150 is directly deposited on the metal portion 110 without the protection of the blocking layer 140; and Examples 2-4 are examples according to embodiments of the present disclosure. Examples 2-4 use various SAM solutions with different solvent compositions (different weight ratios of PGME and PGMEA) with the same blocking compound (such as ODPA). Aluminum contents and copper contents in Examples 1-4 are measured by X-ray photoelectron spectroscopy (XPS). According to the results of Table 1, Example 1 has the largest Al/Cu ratio because of no blocking layer; Examples 2-4 have small Al/Cu ratio because of good protection of blocking layers.

TABLE 1

| Example | Solvent | Al/Cu |
| --- | --- | --- |
| 1 | without protection of the blocking layer | 3.079 |
| 2 | 70 wt. % PGME and 30 wt. % PGMEA | 0.031 |
| 3 | 60 wt. % PGME and 40 wt. % PGMEA | 0.06 |
| 4 | 80 wt. % PGME and 20 wt. % PGMEA | 0.05 |

Furthermore, a resistance of the metal portion 110 in Example 2 before forming the blocking layer 140 is 97 ohm/cm, and the resistance of Example 2 becomes 98 ohm/cm after the deposition of the dielectric layer 150 and the removal of the blocking layer 140. Examples 3 and 4 had similar results to Example 2. The resistance of the metal portion 110 in each of Examples 2 through 4 is almost unchanged before and after the deposition of the dielectric layer 150, meaning that the solvents of Examples 2-4 do not affect the resistance of the metal portion 110. In a contrast example in which THF is used as the solvent. The resistance of the metal portion 110 in the example of THF before the deposition of the dielectric layer 150 is 85 ohm/cm, and becomes 98 ohm/cm after the deposition of the dielectric layer 150 and the removal of the blocking layer 140. The resistance of the metal portion 110 increased about 10% in the example of THF, and the increased resistance may lead to defects of the semiconductor devices.

Accordingly, the SAM solution of the present disclosure may provide more sufficient protection to the metal portion 110 without affecting the resistance of the metal portion 110. In some embodiments, the blocking layer 140 formed by the SAM solution of the present disclosure is able to sustain a high temperature operation, for example, up to about 150° C. In other example, the high temperature may be up to about 250° C.

Figure 2:
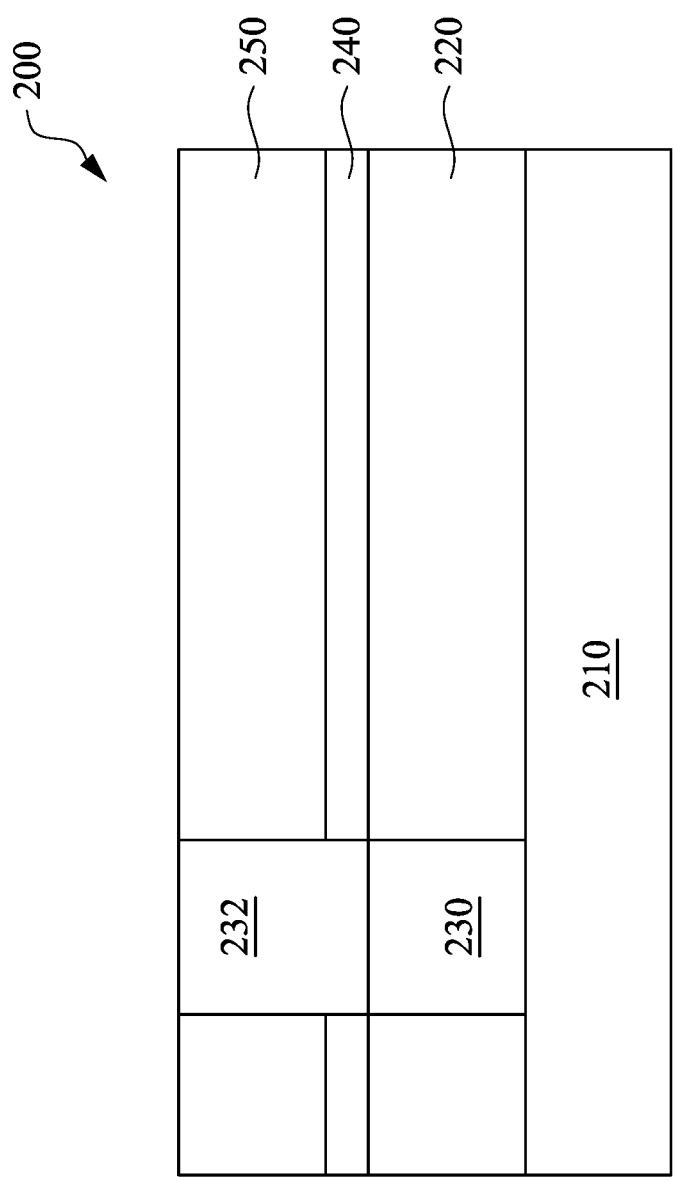
FIG. 2 is a schematic cross-sectional view showing an interconnect structure of a semiconductor structure in accordance with some embodiments of the present disclosure.

FIG. 2 is a schematic cross-sectional view showing an interconnect structure of a semiconductor structure in accordance with some embodiments of the present disclosure. An interconnect structure 200 includes a substrate 210, a first inter-layer dielectric (ILD) layer 220, a first metal portion 230, a second metal portion 232, a dielectric layer 240 and a second ILD layer 250. The first ILD layer 220 is disposed on the substrate 210. The first metal portion 230 and the second metal portion 232 are disposed on the substrate 210 and through the first ILD layer 220, the dielectric layer 240 and the second ILD layer 250. The second metal portion 232 is disposed on and electrically connected to the first metal portion 230. In some embodiments, the substrate 210 may be a semiconductor substrate including any type of semiconductor body (e.g., silicon, SiGe, SOI) such as a semiconductor wafer and/or one or more die on a wafer, as well as any other type of semiconductor and/or epitaxial layers associated therewith. In some embodiments, the semiconductor substrate 210 includes a silicon starting material, such as a single-crystal silicon with a <100> orientation. In other embodiments, the semiconductor substrate 210 may include an epitaxial layer grown on the surface of the substrate 210. The substrate 210 may also include other conductive, insulative and semiconductive portions. For example, the substrate 210 includes shallow trench isolations and various p-type doped regions and/or n-type doped regions, implemented by a process such as ion implantation and/or diffusion. Those doped regions include n-well, p-well, LDD, heavily doped S/D, and various channel doping profiles configured to form various IC devices, such as a CMOSFET, imaging sensor, and/or LED. The substrate 210 may further include other functional features such as a resistor or a capacitor formed in and on the substrate 210. In some embodiments, the first metal portion 230 and the second metal portion 232 may include same or different metal materials, such as tungsten or copper. In some embodiments, the first ILD layer 220 and the second ILD layer 250 may respectively include an oxide, $SiO_2$, carbon-doped $SiO_2$, borophosilicate glass (BPSG), tetraethoxysilane (TEOS), spin-on glass (SOG), undoped silicate glass (USG), fluorinated silicate glass (FSG), porous silicon dioxide, porous carbon-doped silicon dioxide, spin-on organic polymeric dielectrics, spin-on silicon based polymeric dielectric, high-density plasma (HDP) oxide, or plasma-enhanced TEOS (PETEOS). In some embodiment, the dielectric layer 240 may include aluminum oxide, cobalt oxide or zirconium oxide.

Figure 3A:
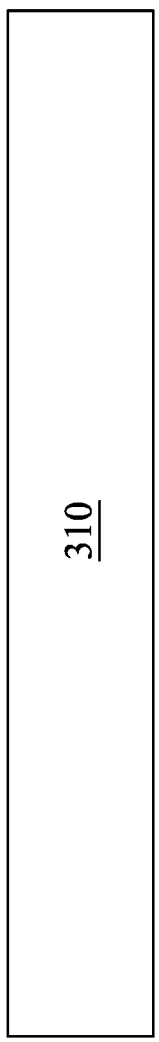
FIG. 3A through FIG. 3H are schematic cross-sectional views showing intermediate stages for forming an interconnect structure of a semiconductor structure in accordance with some embodiments of the present disclosure.

FIG. 3A through FIG. 3H are schematic cross-sectional views showing intermediate stages for forming an interconnect structure 300 of a semiconductor structure in accordance with some embodiments of the present disclosure, in which a selective deposition method is applied to a DoD process. As shown in FIG. 3A, a substrate 310 is provided. The substrate 310 may be similar to the substrate 210 of FIG. 2.

Figure 3B:
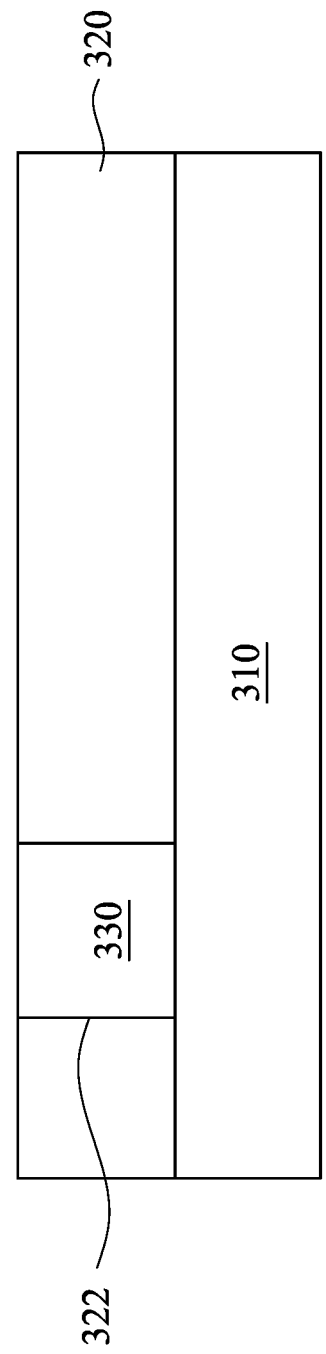

As shown in FIG. 3B, a first ILD layer 320 is formed on the substrate 310. In some embodiments, the first ILD layer 320 may be formed by a deposition process, such as chemical vapor deposition (CVD) or physical vapor deposition (PVD), while the present disclosure is not limited to the examples. In some embodiments, the first ILD layer 320 may include an oxide, $SiO_2$, carbon-doped $SiO_2$, borophosphosilicate glass (BPSG), tetraethoxysilane (TEOS), spin-on glass (SOG), undoped silicate glass (USG), fluorinated silicate glass (FSG), porous silicon dioxide, porous carbon-doped silicon dioxide, spin-on organic polymeric dielectrics, spin-on silicon based polymeric dielectric, high-density plasma (HDP) oxide, or plasma-enhanced TEOS (PETEOS). After the formation of the first ILD layer 320, a first opening 322 is formed through the first ILD layer 320 by an etch operation to expose a portion of the substrate 310. The first opening 322 is then filled with a first metal material, thereby forming the first metal portion 330. In some embodiments, the first metal material may be filled by a deposition process, such as PVD, sputtering or electroplating. In some embodiments, a CMP process may be performed to remove excess first metal material. In some embodiments, the first metal material is copper. In other embodiments, the first metal material may be tungsten.

In some embodiments, a pre-clean operation similar to that of FIG. 1B, FIG. 1F and FIG. 1G may be optionally performed before subsequent operations (such as, selectively depositing the first blocking layer 333 on the first metal portion 330). For example, a surface of the first metal portion 330 and a surface of the first ILD layer 320 may be pre-cleaned by the UV-treated ozone (decomposed into $O_2$, O radicals, O ions) after the CMP process.

Figure 3C:
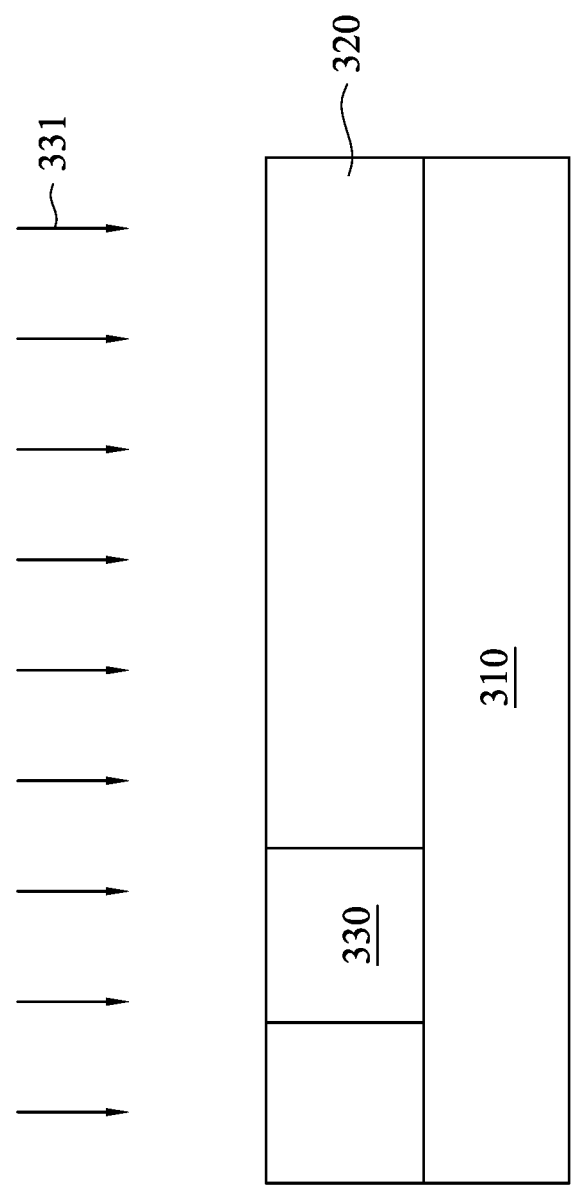
Figure 3D:
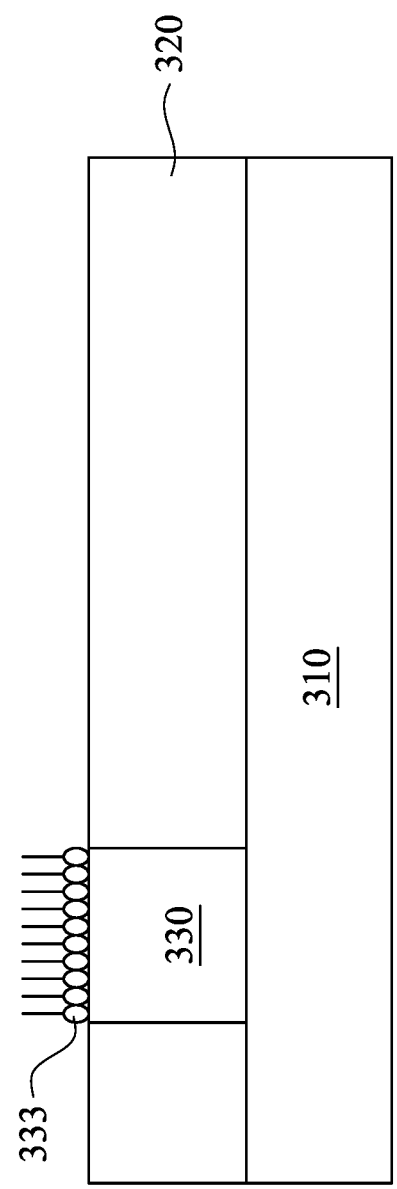

The SAM solution 331 may be prepared according to the aforementioned description, in which the SAM solution 331 includes the at least one blocking compound and the multi-solvent system. The at least one blocking compound includes one or both of a thiol compound and a phosphonic acid compound. The at least one blocking compound is configured to adhere to the first metal portion 330. The multi-solvent system includes an alcohol having 1 to 6 carbon atoms, and an ester having 1 to 6 carbon atoms. In one example, the SAM solution 331 includes the phosphonic acid compound, 70 wt. % PGME and 30 wt. % PGMEA (dielectric constant k=12). In some embodiments, PGME and PGMEA are miscible with each other. Next, as shown in FIG. 3C and FIG. 3D, a first blocking layer 333 is selectively deposited on the first metal portion 330 using a SAM solution 331. In some embodiments, selectively depositing the first blocking layer 333 on the first metal portion 330 is performed by applying the SAM solution 331 onto a surface of the first ILD layer 320 and a surface of the first metal portion 330, such that the at least one blocking compound adheres to the first metal portion 330. And the substrate 310 is heated (e.g. about 100° C. to about 150° C.) to remove the multi-solvent system of the SAM solution 331 on the first ILD layer 320 and the first metal portion 330 to form a first blocking layer 333 (i.e. a SAM) on the first metal portion 330 (i.e. the at least one blocking compound remains as the first blocking layer 333). However, when the substrate 310 is heated under a temperature greater than 150° C., the structure underlying the first blocking layer 333 may be further oxidized because the first blocking layer 333 has not been completely formed, in which the oxidation of the underlying structure may cause defects of the semiconductor device. In some embodiments, the multi-solvent system may be recycled and reused.

Figure 3E:
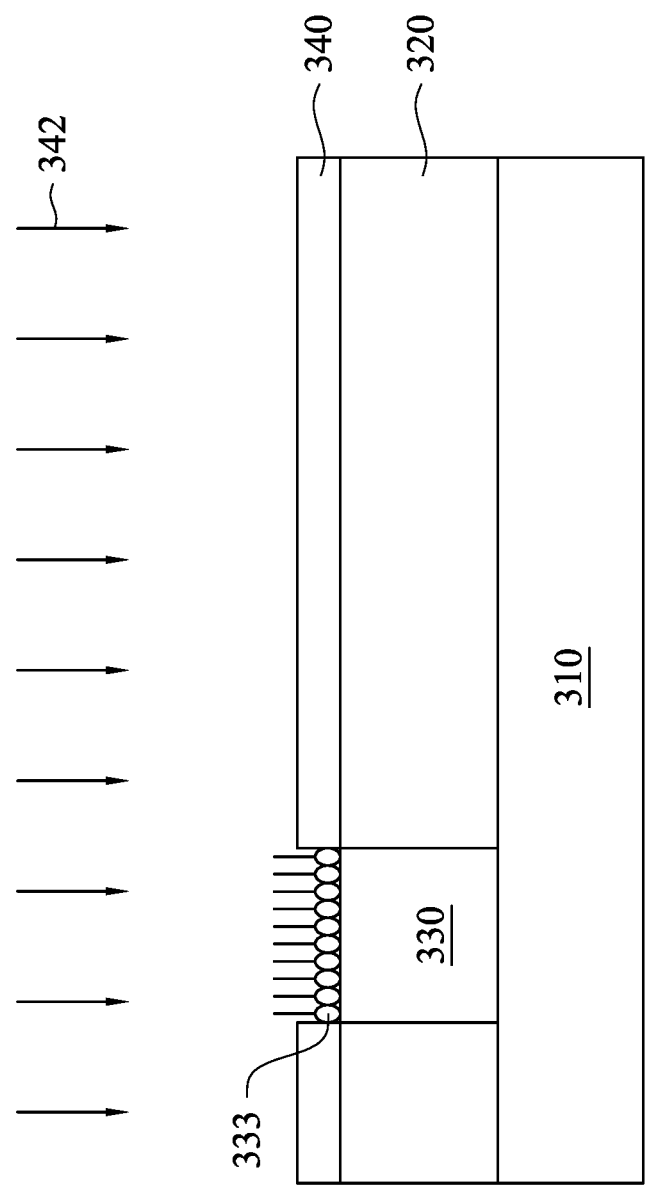

Then, as shown in FIG. 3E, a first dielectric layer 340 is selectively deposited on the first ILD layer 320 using the first blocking layer 333 as a stencil. The first blocking layer 333 is able to block the deposition of the first dielectric layer 340 on the first metal portion 330, and a patterning operation without lithography may be achieved in the present disclosure. In some embodiments, the first dielectric layer 340 may be deposited by an atomic layer deposition process 342. In some embodiments, the first dielectric layer 340 may be a metal oxide layer. In some embodiments, the first dielectric layer 340 may include aluminum oxide, cobalt oxide or zirconium oxide. In some embodiments, the first dielectric layer 340 has a thickness substantially equal to or greater than 50 Å. In a further embodiment, the first dielectric layer 340 has the thickness substantially equal to or greater than 100 Å. When the thickness of the first dielectric layer 340 is less than 50 Å or the first dielectric layer 340 is not formed by the material mentioned above, the first dielectric layer 340 may be unable to provide sufficient protection to the underlying first ILD layer 320. The upper limit of the thickness of the first dielectric layer 340 may vary in accordance with requirements of a semiconductor fabrication process.

Figure 3F:
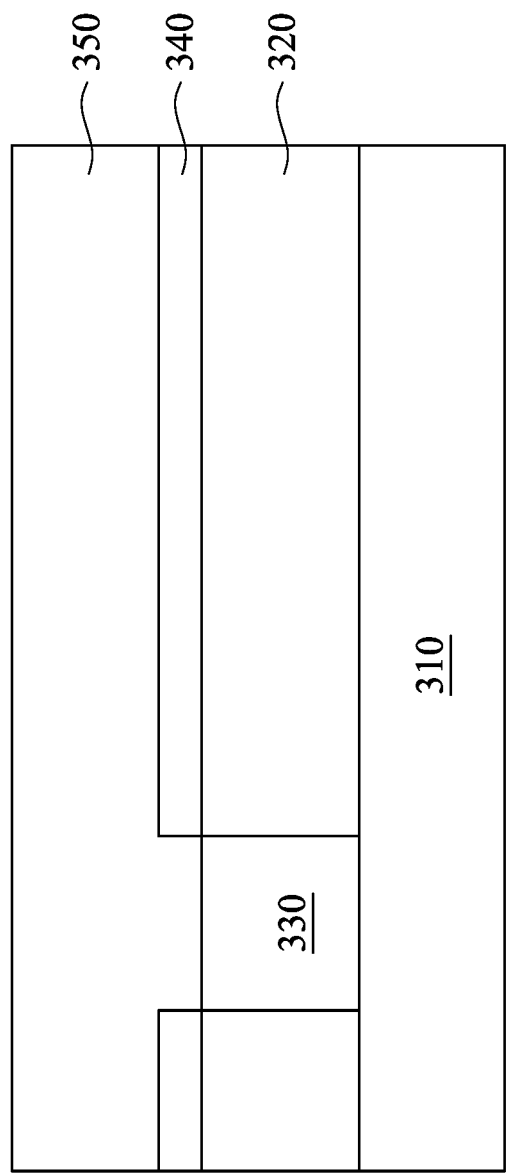

Thereafter, as shown in FIG. 3F, the first blocking layer 333 is removed from the first metal portion 330. The first blocking layer 333 may be removed by applying acetic acid over the first blocking layer 333 and the first dielectric layer 340 when the first blocking layer 333 is formed by the phosphonic acid compound. Or, the first blocking layer 333 may be removed by heating (e.g. greater than about 100° C. to about 150° C.) the substrate 310 when first the blocking layer 333 is formed by the thiol compound. In the embodiments where the phosphonic acid compound and the thiol compound are involved in the SAM solution, the above two removal operations may be both performed. After removal of the first blocking layer 333, a second ILD layer 350 is then formed on the first dielectric layer 340 and the first metal portion 330. The material and the formation method of the second ILD layer 350 are similar to those of the first ILD layer 320, and may not be repeated herein.

Figure 3G:
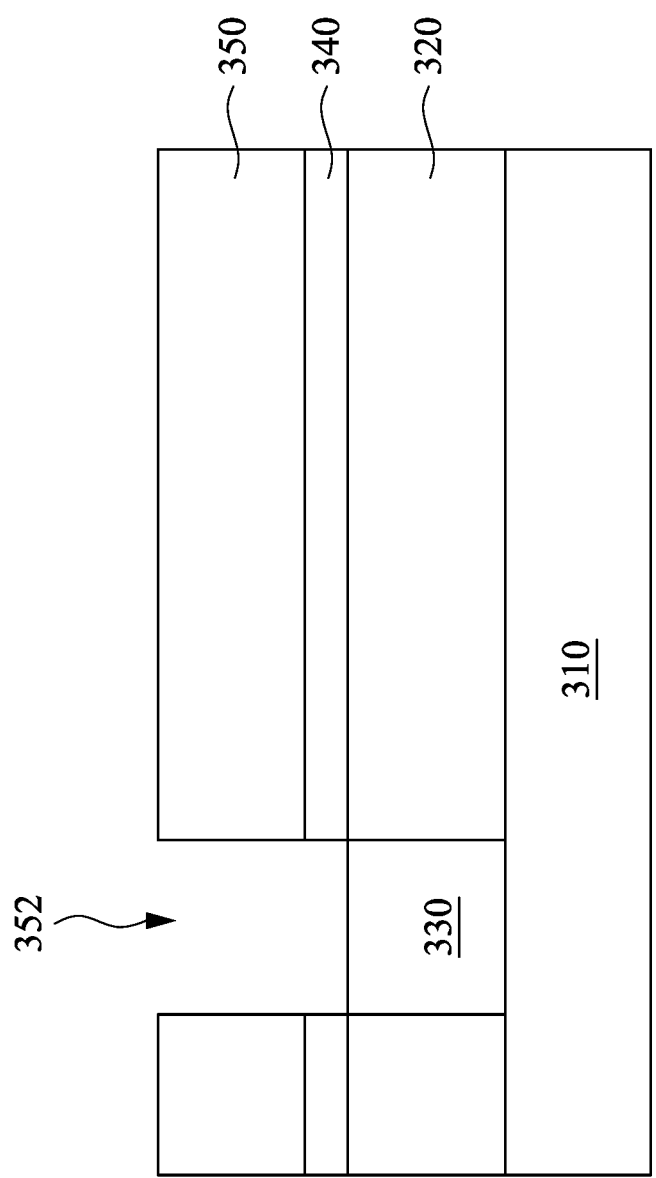

Then, as shown in FIG. 3G, a second opening 352 is formed through the second ILD layer 350 to expose the surface of the first metal portion 330. Formation of the second opening 352 may be performed by an etch operation using a mask. It is noted that a misalignment of the etching operation often occurs, particularly in a device having a smaller dimension, and the first dielectric layer 340 is used as the etch stop layer to prevent damages to the underlying first ILD layer 320 caused by the misalignment. Therefore, the first dielectric layer 340 may act as an etch stop layer to protect the underlying first ILD layer 320 from being etched during removal of the first blocking layer 333 or formation of an opening 352.

Figure 3H:
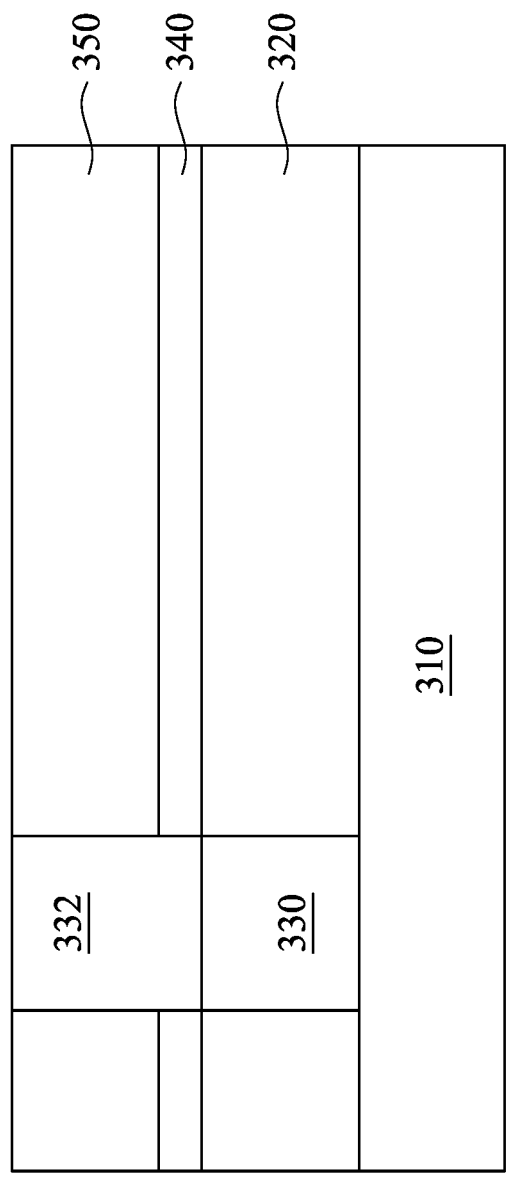

Thereafter, as shown in FIG. 3H, the second opening 352 is filled with a second metal material, thereby forming a second metal portion 332 electrically connected to the first metal portion 330. Formation of the second metal portion 332 is similar to the formation of the first metal portion 330. In some embodiments, the second metal material used to form the second metal portion 332 may be copper which is same as the first metal material used to form the first metal portion 330. In other embodiments, the second metal material may be different from the first metal material, for example, the first metal material may be tungsten, and the second metal material may be copper.

Figure 4:
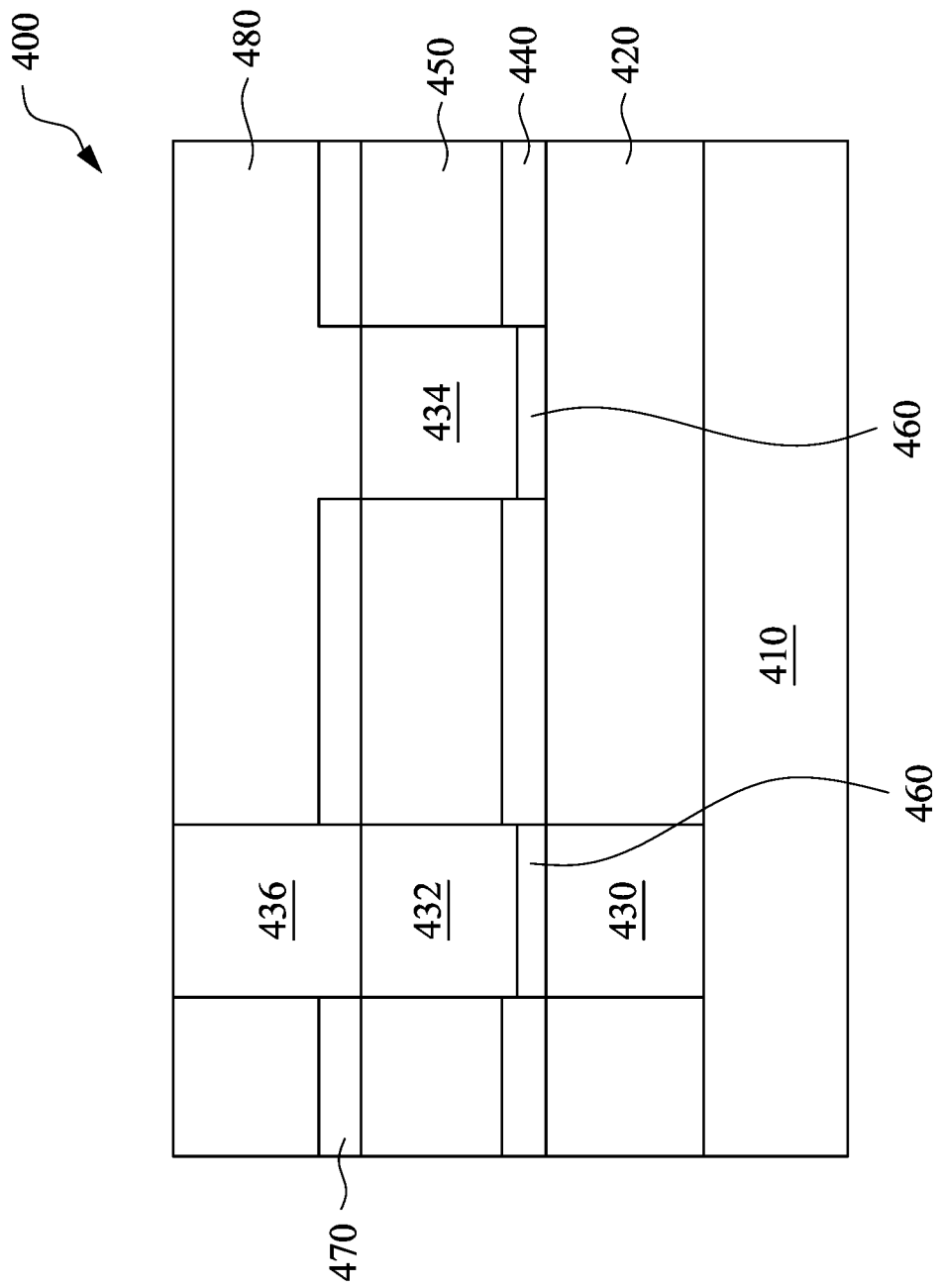
FIG. 4 is a schematic cross-sectional view showing an interconnect structure of a semiconductor structure in accordance with some embodiments of the present disclosure.

FIG. 4 is a schematic cross-sectional view showing an interconnect structure 400 of a semiconductor structure in accordance with some embodiments of the present disclosure. The interconnect structure 400 includes a substrate 410, a first ILD layer 420, a first metal portion 430, a second metal portion 432, a third metal portion 434, a fourth metal portion 436, a first dielectric layer 440, a second ILD layer 450, a seed layer 460, a second dielectric layer 470 and a third ILD layer 480. The first ILD layer 420 is disposed on the substrate 410. The first dielectric layer 440 is disposed on the first ILD layer 420. The second ILD layer 450 is disposed on the first dielectric layer 440. The second dielectric layer 470 is disposed on the second ILD layer 450. The third ILD layer 480 is disposed on the second dielectric layer 470. The first metal portion 430, the second metal portion 432 and the fourth metal portion 436 are sequentially disposed on the substrate 410 from bottom to top and through the first ILD layer 420, the first dielectric layer 440, the second ILD layer 450, the second dielectric layer 470 and the third ILD layer 480. The third metal portion 434 is disposed adjacent to the second metal portion 432 through the second ILD layer 450. The seed layer 460 is disposed between the first metal portion 430 and the second metal portion 432 and in the first dielectric layer 440. The seed layer 460 is also disposed between the first ILD layer 420 and the third metal portion 434 and in the first dielectric layer 440.

Figure 5A:
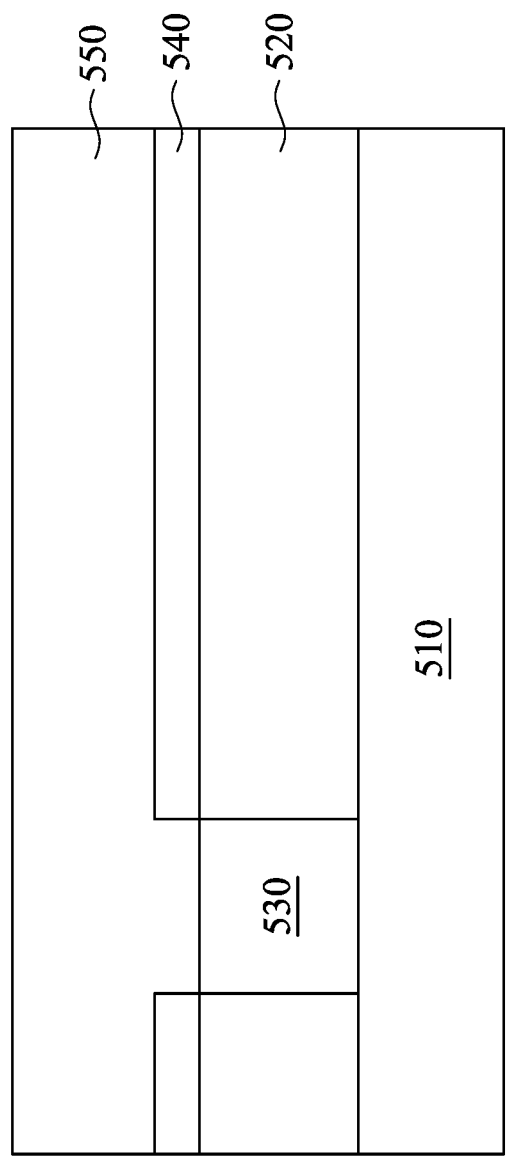
FIG. 5A through FIG. 5I are schematic cross-sectional views showing intermediate stages for forming an interconnect structure of a semiconductor structure in accordance with some embodiments of the present disclosure.

Hereinafter, a selective deposition method for forming an interconnect structure similar to the interconnect structure 400 is described. Referring to FIG. 5A through FIG. 5I, FIG. 5A through Fig. 5I are schematic cross-sectional views showing intermediate stages for forming an interconnect structure of a semiconductor structure in accordance with some embodiments of the present disclosure. As shown in FIG. 5A, a substrate 510, a first ILD layer 520, a first metal portion 530 (formed by filling a first opening in the first ILD layer 520 with the first metal material), a first dielectric layer 540 (selectively deposited using a first blocking layer) and a second ILD layer 550 are formed by a similar method of forming the substrate 310, the first ILD layer 320, the first metal portion 330, the first dielectric layer 340 and the second ILD layer 350 of FIG. 3A through FIG. 3F.

Figure 5B:
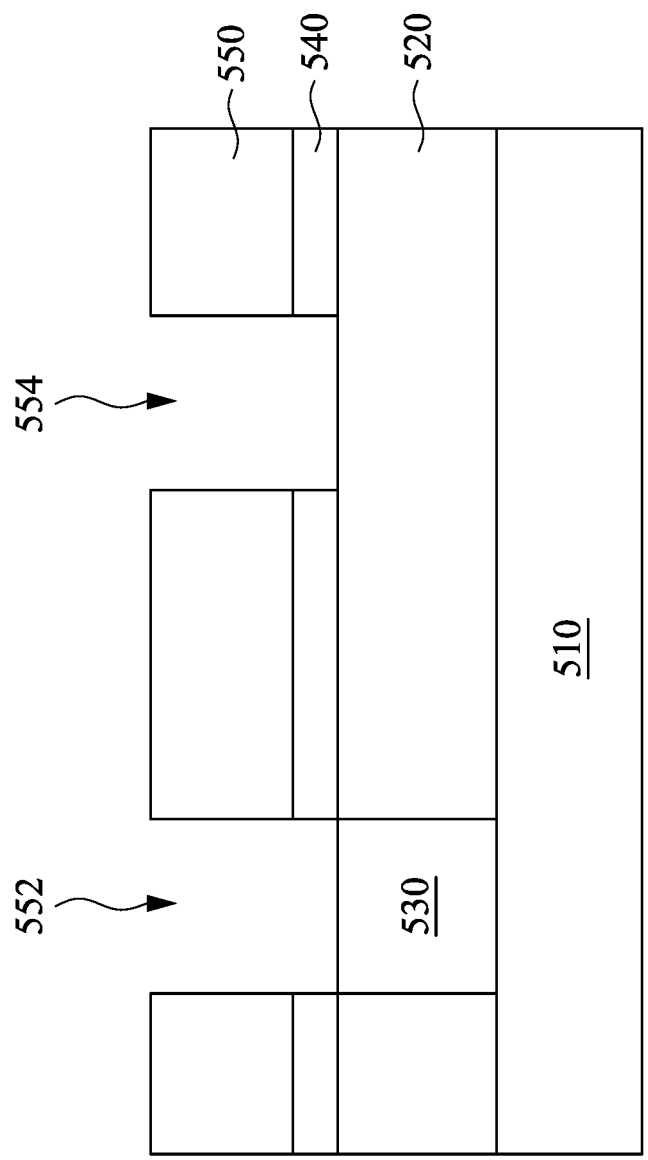

As shown in FIG. 5B, a second opening 552 and a third opening 554 are formed through the second ILD layer 550, such that the second opening 552 exposes the first metal portion 530, and the third opening 554 is adjacent to the second opening 552 and exposes a portion of the first ILD layer 520. In some embodiments, forming the third opening 554 includes etching a portion of the second ILD layer 550 to expose a portion of the first dielectric layer 540, followed by etching the portion of the first dielectric layer 540 to expose the portion of the first ILD layer 520. Etching the second ILD layer 550 and etching the first dielectric layer 540 may be performed by different etch operations using different etchants with the same mask. For example, etching the second ILD layer 550 may use a fluoride-containing etchant, while etching the first dielectric layer 540 may use a base as an etchant to perform a wet etch operation.

Figure 5C:
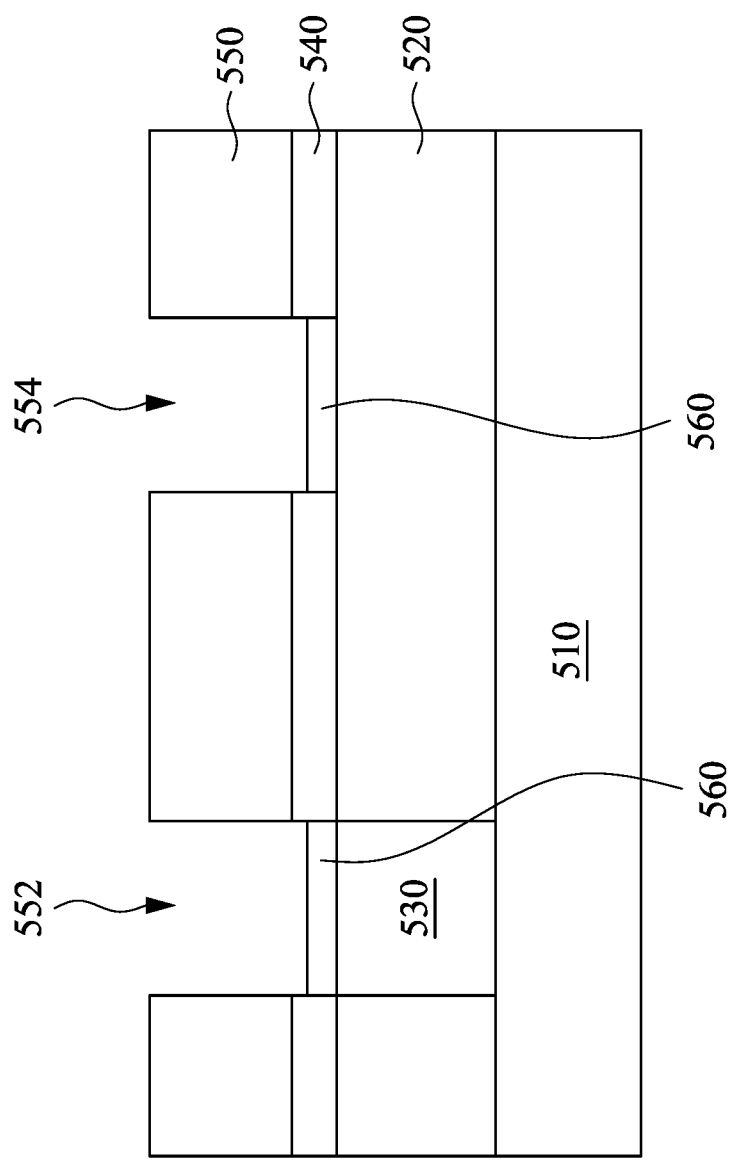

Next, as shown in FIG. 5C, a seed layer 560 may be deposited into the second opening 552 and the third opening 554. In some embodiments, the seed layer 560 may include palladium (Pd), cobalt (Co), nickel (Ni), aluminum (Al), or platinum (Pt). Generally, the seed layer 560 improves adherence between the first ILD layer 520 and a third metal portion 534 formed later.

Figure 5D:
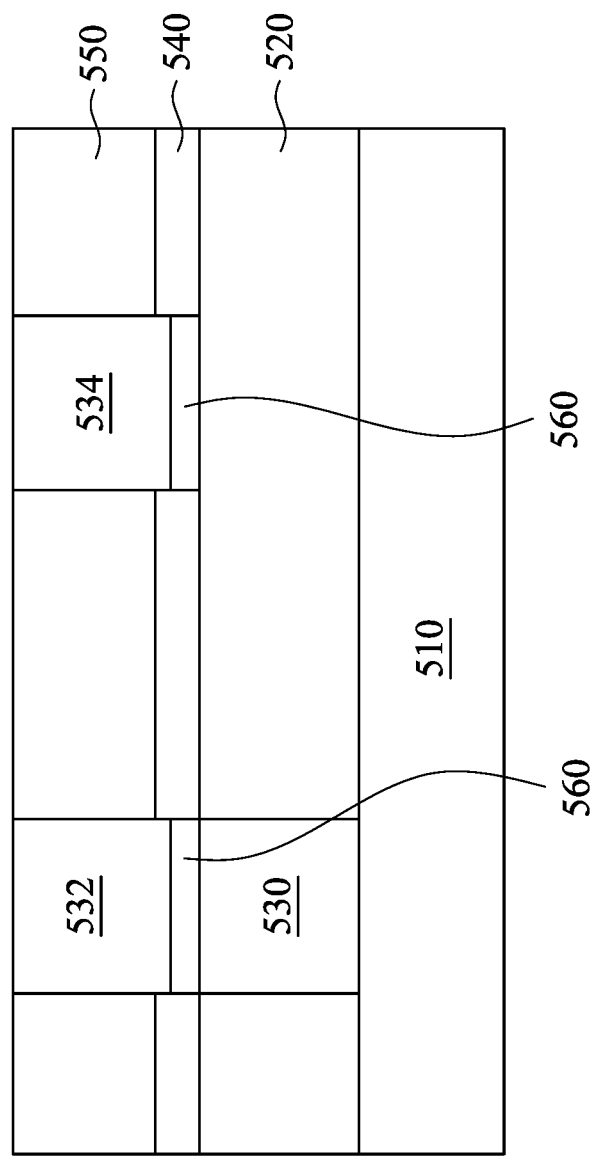

Thereafter, as shown in FIG. 5D, the second opening 552 and the third opening 554 are respectively filled with a second metal material, thereby forming a second metal portion 532 in the second opening 552 and the third metal portion 534 in the third opening 554. The second metal portion 532 is electrically connected to the first metal portion 530. The second metal material may include copper.

Figure 5E:
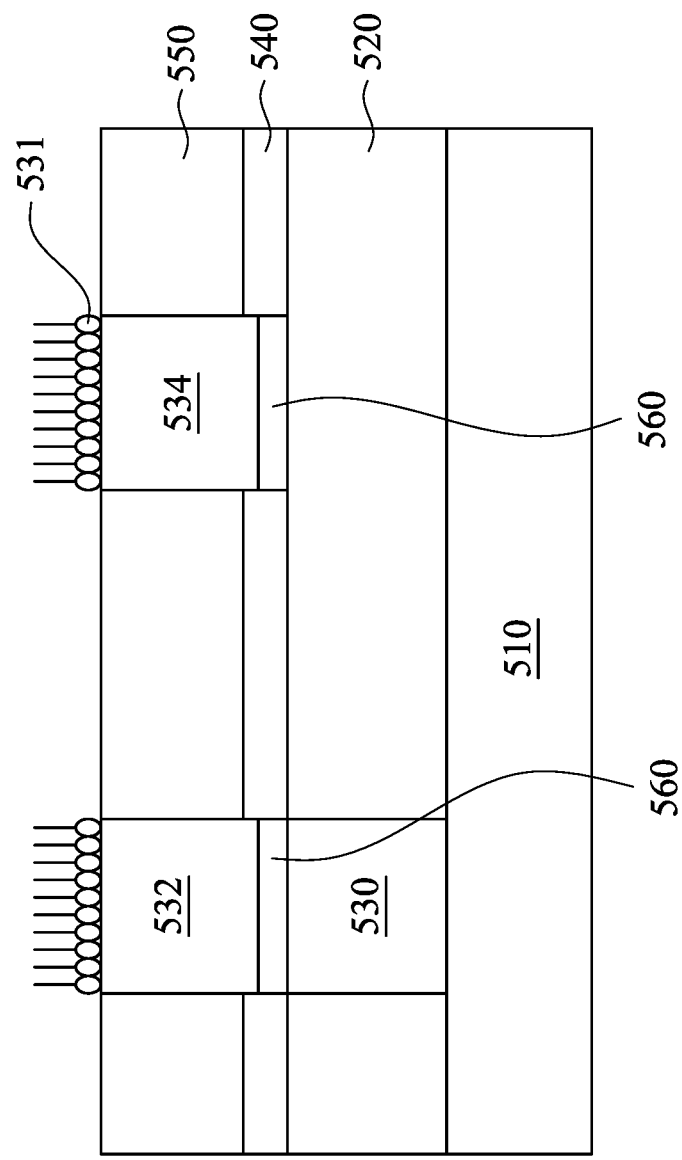

Next, as shown in FIG. 5E, a second blocking layer 531 is selectively deposited on the second metal portion 532 and the third metal portion 534. The selective deposition of the second blocking layer 531 is similar to the selective deposition of the first blocking layer 333 shown in FIG. 3C and FIG. 3D. For example, the SAM solution (e.g. the SAM solution 331) is applied over a surface of the second ILD layer 550, a surface of the second metal portion 532 and a surface of the third metal portion 534. The substrate 510 is heated (e.g. about 100° C. to about 150° C.) to remove the multi-solvent system of the SAM solution over the surface of the second ILD layer 550, the surface of the second metal portion 532 and the surface of the third metal portion 534, such that the blocking compound (e.g. the phosphonic acid compound) remains as the second blocking layer 531 on the second metal portion 532 and the third metal portion 534.

Figure 5F:
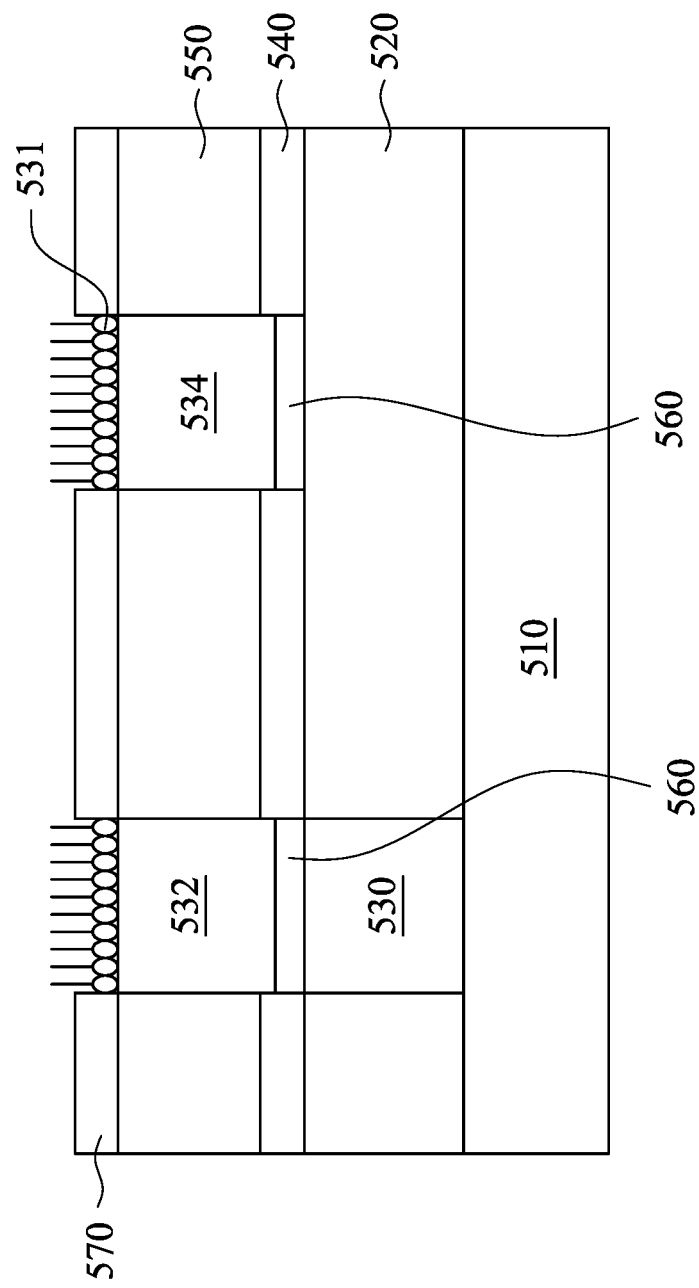

Then, as shown in FIG. 5F, a second dielectric layer 570 may be selectively deposited on the second ILD layer 550 using the second blocking layer 531 as a stencil. The selective deposition and a material of the second dielectric layer 570 are similar to the selective deposition and the material of first dielectric layer 340 shown in FIG. 3E, and may not be repeated herein.

Figure 5G:
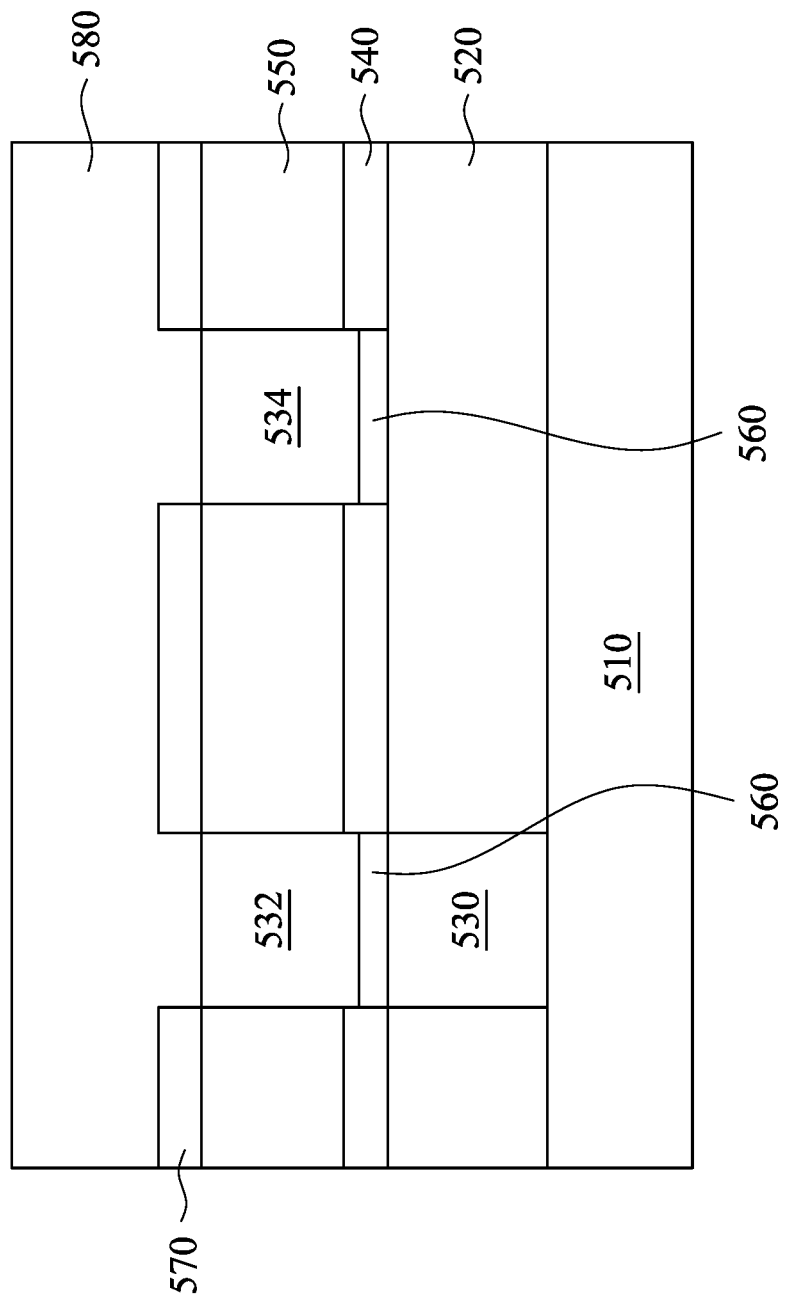

Next, as shown in FIG. 5G, the second blocking layer 531 on the second metal portion 532 and the third metal portion 534 are removed. The removal of the second blocking layer 531 is similar to the removal of the first blocking layer 333, and may not be repeated herein. Thereafter, a third ILD layer 580 is formed on the second dielectric layer 570, the second metal portion 532 and the third metal portion 534. The formation of the third ILD layer 580 is similar to the formation of the first ILD layer 520 and the second ILD layer 550 and is not repeated.

Figure 5H:
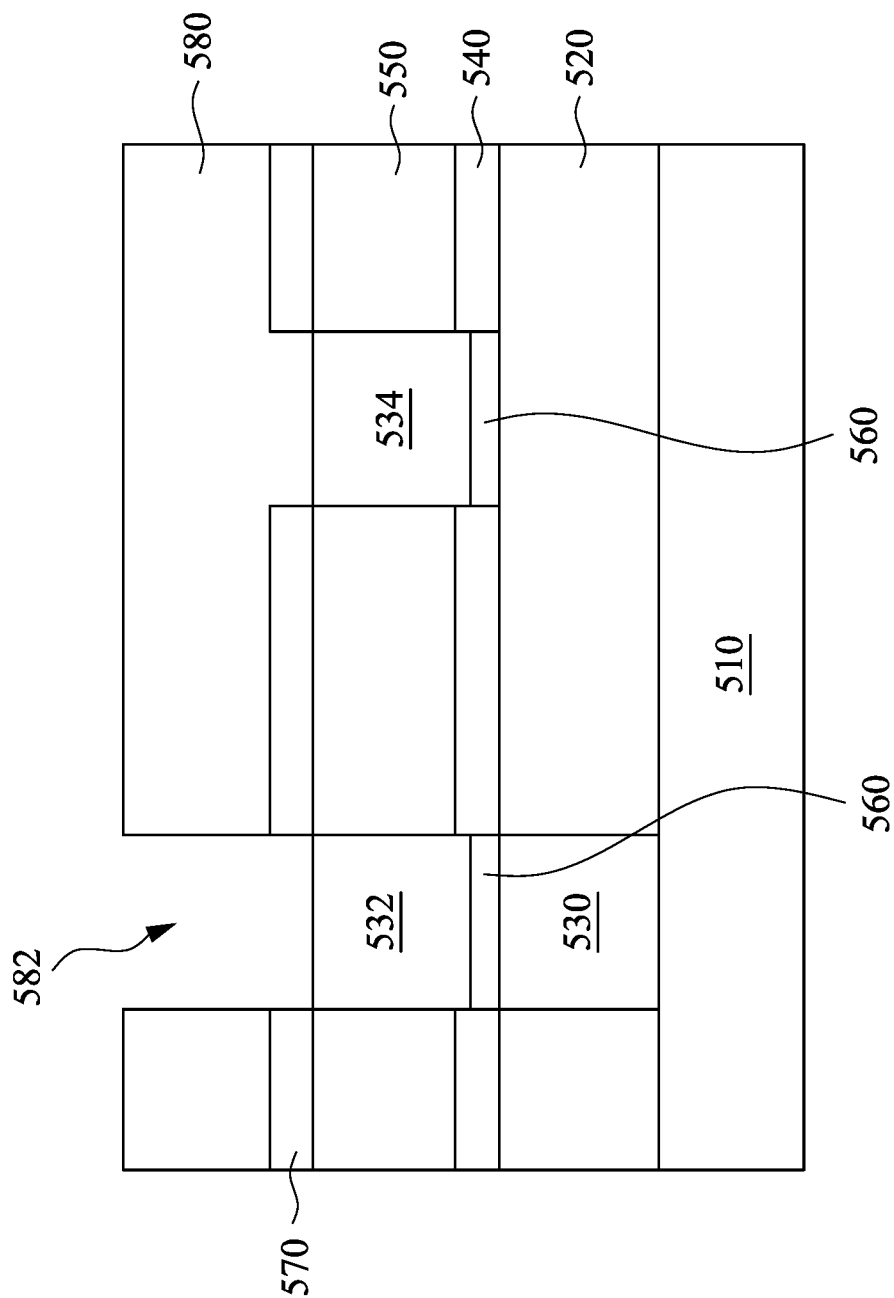

After the formation of the third ILD layer 580, a fourth opening 582 is formed through the third ILD layer 580 to expose the surface of the second metal portion 532, as shown in FIG. 5H. The second dielectric layer 570, similar to the first dielectric layer 340 shown in FIG. 3G, acts as the etch stop layer to prevent damages to the second ILD layer 550 during the formation of the fourth opening 582.

Figure 5I:
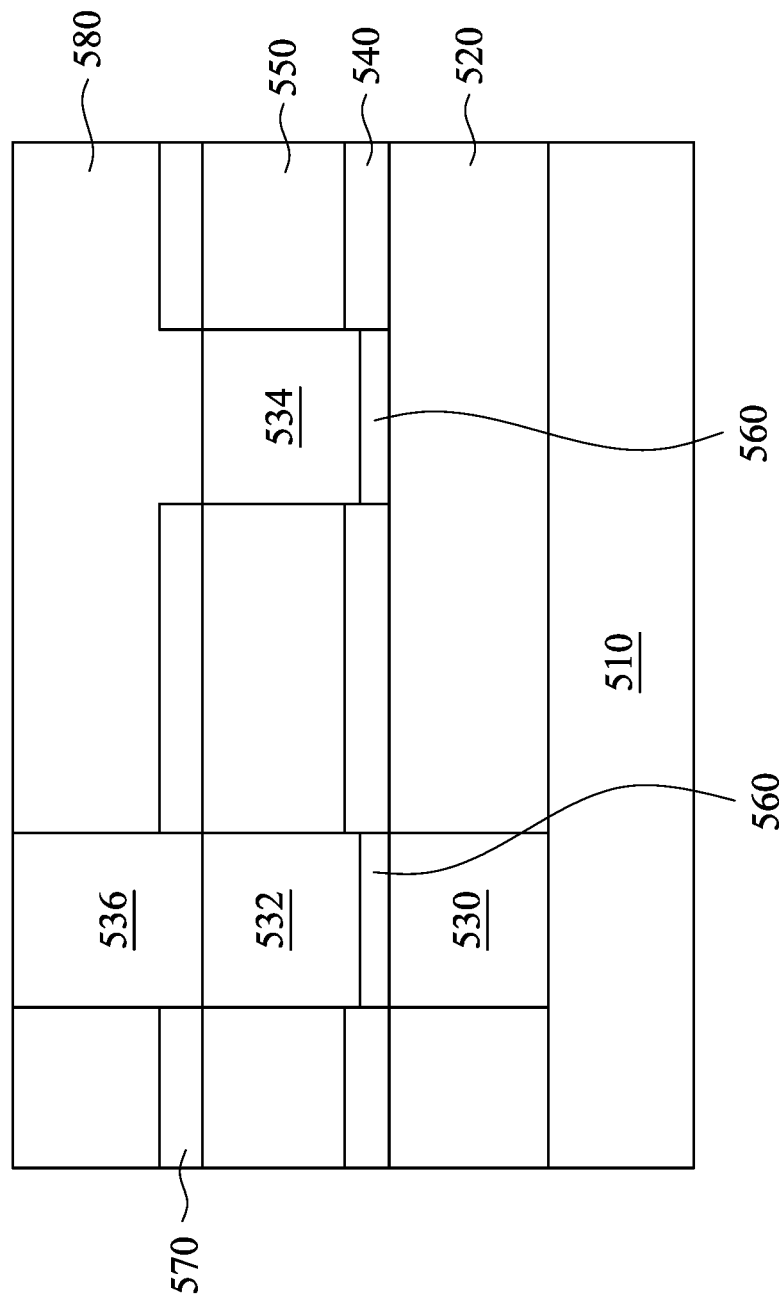

Then, as shown in FIG. 5I, the fourth opening 582 is filled with a third metal material, thereby forming a fourth metal portion 536 electrically connected to the second metal portion 532. In some embodiment, the third metal material may include copper or tungsten.

Figure 6:
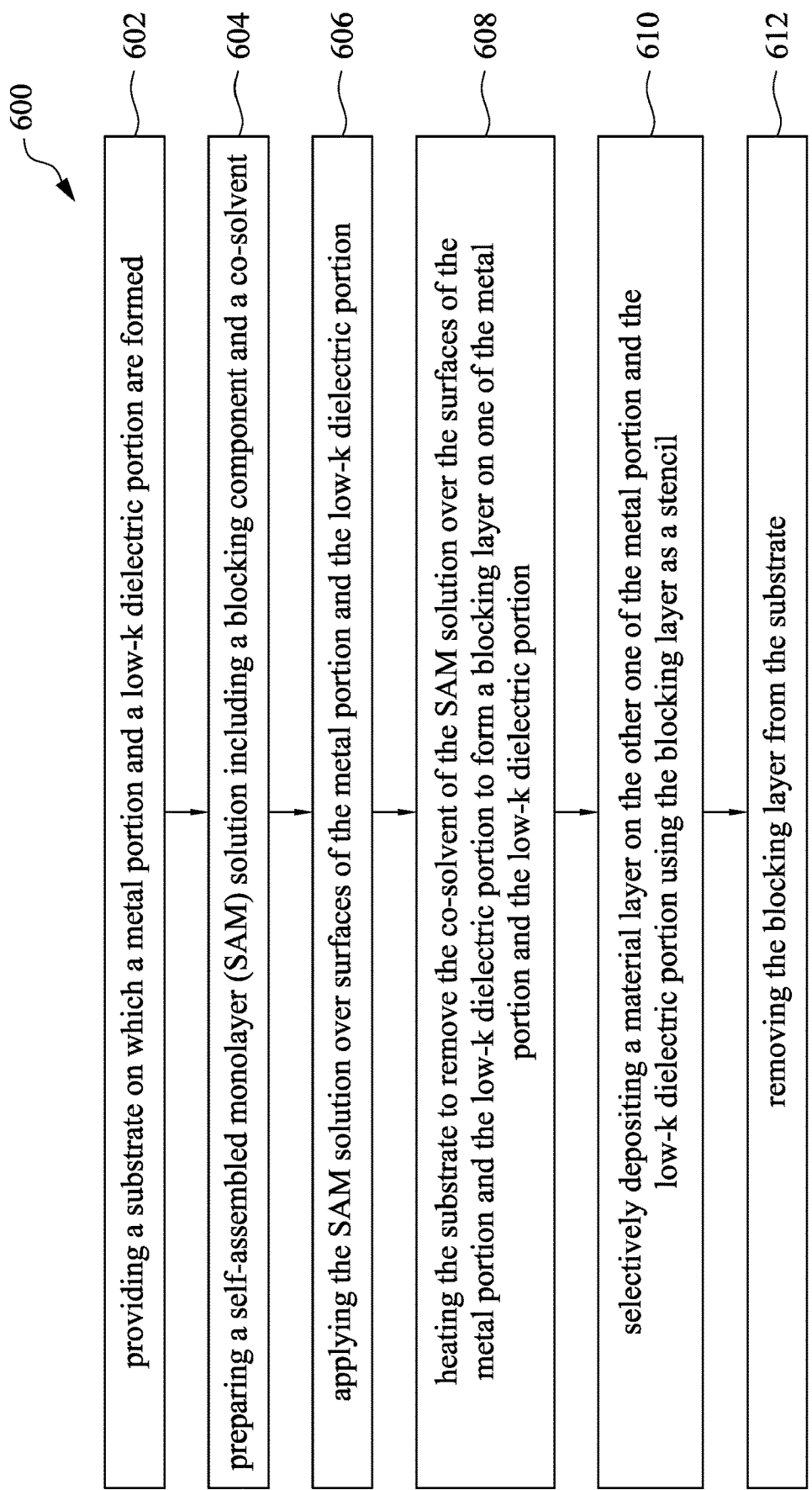
FIG. 6 is a flowchart showing a method for forming a semiconductor structure in accordance with some embodiments of the present disclosure.

FIG. 6 is a flow chart showing a method 600 for forming a semiconductor structure in accordance with some embodiments of the present disclosure. The method 600 can be described in conjunction with FIG. 1A through FIG. 1E. Referring now to FIG. 1A, the method 600 begins at operation 602, in which a substrate 100 with a metal portion 110 and a low-k dielectric portion 120 formed thereon is provided. At operation 604, a self-assembled monolayer (SAM) solution 130 including at least one blocking compound and a multi-solvent system is prepared, in which the at least one blocking compound is configured to adhere to one of the metal portion and the low-k dielectric portion. At operation 606, the SAM solution 130 is applied over surfaces of the metal portion 110 and the low-k dielectric portion 120, as shown in FIG. 1B. Next, at operation 608, the substrate 100 is heated to remove the multi-solvent system of the SAM solution 130 over the surfaces of the metal portion 110 and the low-k dielectric portion 120, as shown in FIG. 1C. At operation 610, a material layer 150 is selectively deposited on the other one of the metal portion 110 and the low-k dielectric portion 120 using the blocking layer 140 as a stencil, as shown in FIG. 1D. At operation 612, the blocking layer 140 is removed from the substrate, as shown in FIG. 1E.

Figure 7A:
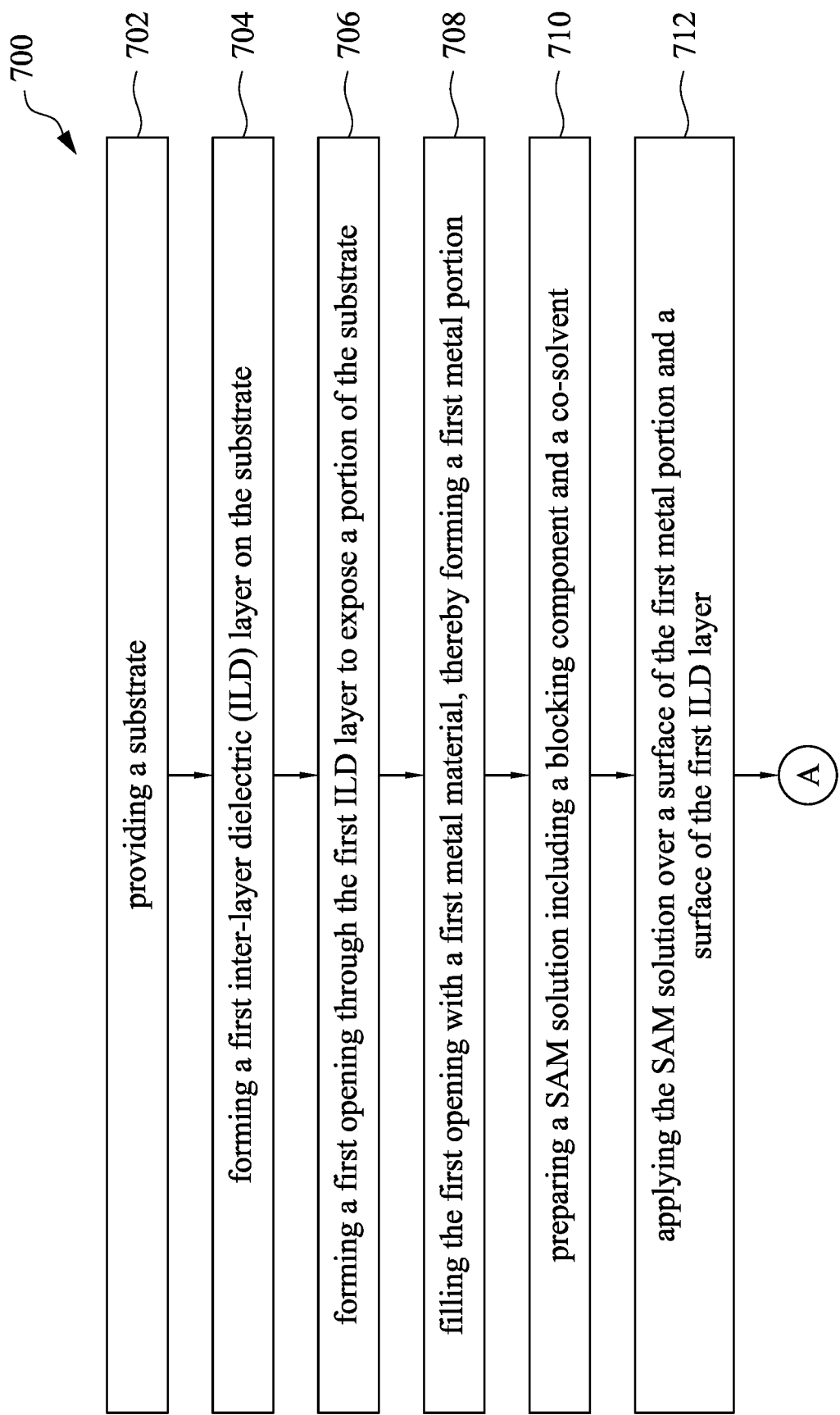
FIG. 7A and FIG. 7B are a flowchart showing a method for forming a semiconductor structure in accordance with some embodiments of the present disclosure.
Figure 7B:
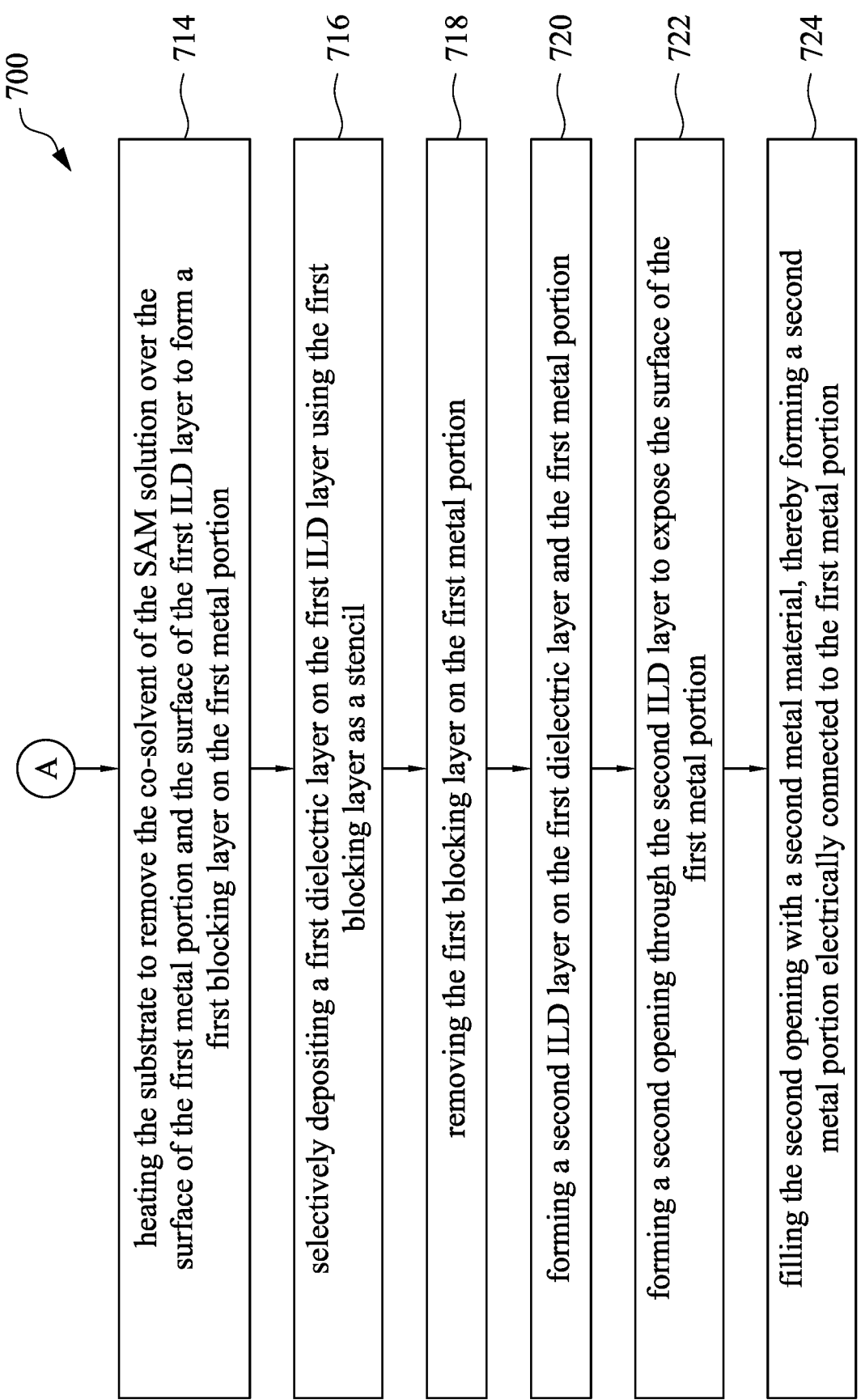

FIG. 7A and FIG. 7B are a flow chart showing a selective deposition method 700 for forming a semiconductor structure in accordance with some embodiments of the present disclosure. Method 700 can be described in conjunction with FIG. 3A through FIG. 3H. The method 700 begins at operation 702, where a substrate 310 is provided, as shown in FIG. 3A. At operation 704, a first ILD layer 320 is formed on the substrate 310. At operation 706, a first opening 322 is formed through the first ILD layer 320 to expose a portion of the substrate 310. At operation 708, the first opening 322 is filled with a first metal material, thereby forming a first metal portion 330, as shown in FIG. 3B. At operation 710, a SAM solution is prepared, in which the SAM solution 331 includes at least one blocking compound and a multi-solvent system, and the at least one blocking compound is configured to adhere to the first metal portion. At operation 712, the SAM solution 331 is applied over a surface of the first metal portion 330 and a surface of the first ILD layer 320, as shown in FIG. 3C. At operation 714, the substrate 310 is heated to remove the multi-solvent system of the SAM solution 331 over the surface of the first metal portion 330 and the surface of the first ILD layer 320 to form a first blocking layer 333 on the first metal portion 330 as shown in FIG. 3D. At operation 716, a first dielectric layer 340 is selectively deposited on the first ILD layer 320 using the first blocking layer 333 as a stencil, as shown in FIG. 3E. At operation 718, the first blocking layer 333 on the first metal portion 330 is removed. At operation 720, a second ILD layer 350 is formed on the first dielectric layer 340 and the first metal portion 330, as shown in FIG. 3F. At operation 722, a second opening 352 is formed through the second ILD layer 350 to expose the surface of the first metal portion 330, as shown in FIG. 3G. At operation 724, the second opening 352 is filled with a second metal material, thereby forming a second metal portion 332 electrically connected to the first metal portion 330, as shown in FIG. 3H.

Figure 8A:
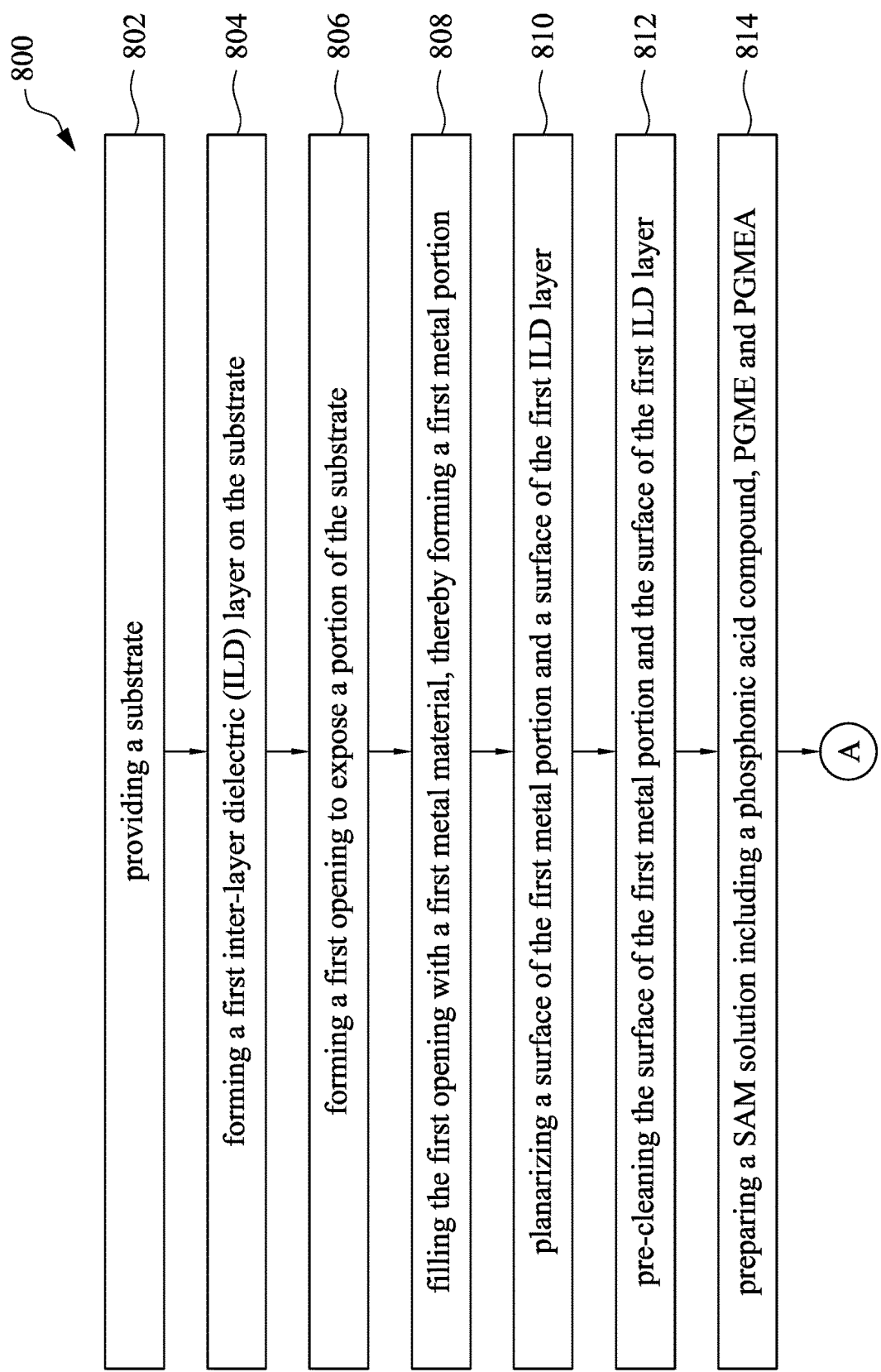
FIG. 8A and FIG. 8B are a flowchart showing a method for forming a semiconductor structure in accordance with some embodiments of the present disclosure.
Figure 8B:
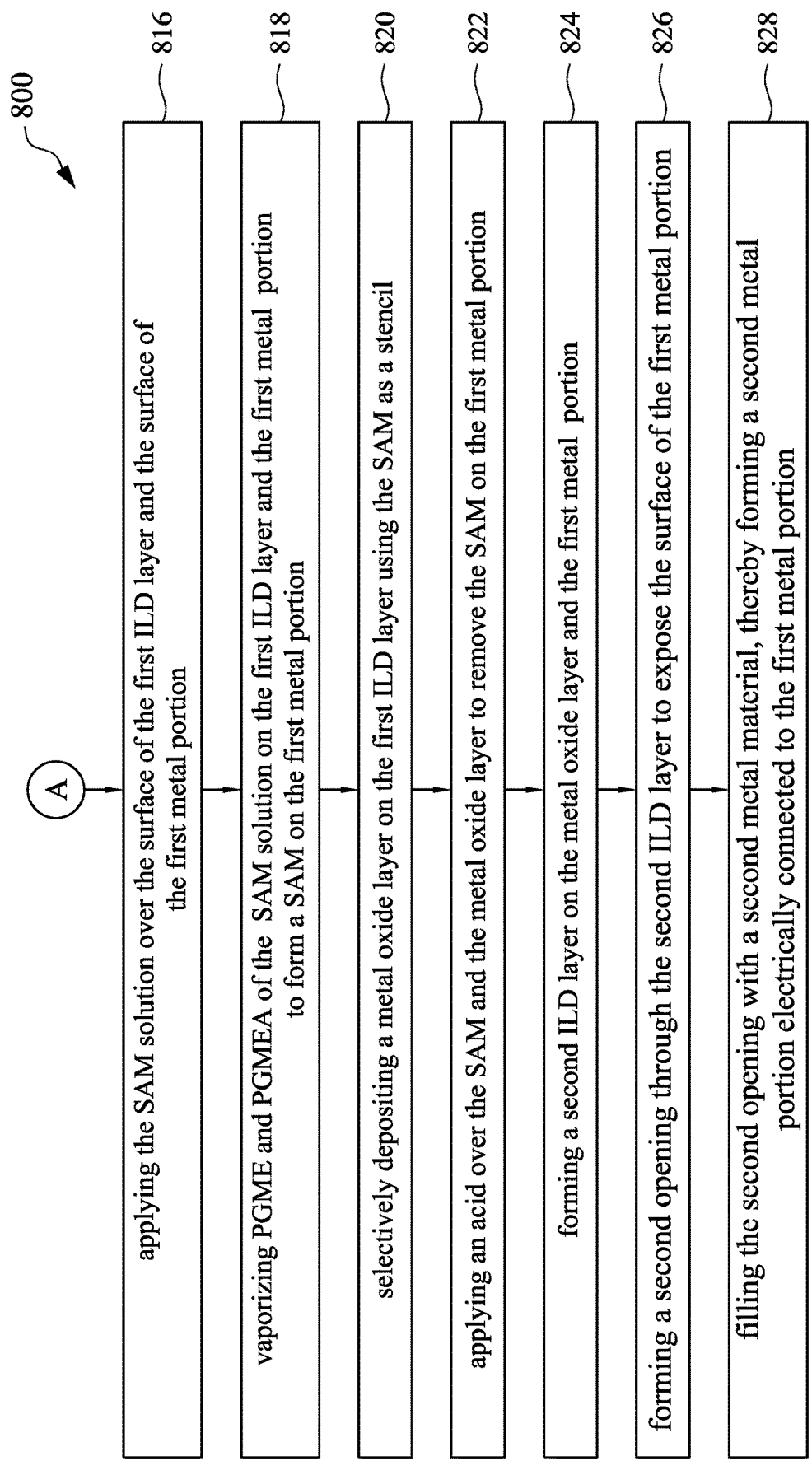

FIG. 8A and FIG. 8B are a flow chart showing a selective deposition method 800 for forming a semiconductor structure in accordance with some embodiments of the present disclosure. The method 800 can be described in conjunction with FIG. 3A through FIG. 3H and FIG. 1F and FIG. 1G. The method 800 begins at operation 802, where a substrate 310 is provided, as shown in FIG. 3A. At operation 804, a first ILD layer 320 is formed on the substrate 310. At operation 806, a first opening 322 is formed through the first ILD layer 320 to expose a portion of the substrate 310. At operation 808, the first opening 322 is filled with a first metal material, thereby forming a first metal portion 330, as shown in FIG. 3B. At operation 810, a surface of the first metal portion 330 and a surface of the first ILD layer 320 are planarized. At operation 812, the surface of the first metal portion and the surface of the first ILD layer are pre-cleaned, as shown in FIG. 1F and FIG. 1G. At operation 814, a SAM solution 331 is prepared, in which the SAM solution 331 includes a phosphonic acid compound, PGME and PGMEA, and the phosphonic acid compound is configured to adhere to the first metal portion. At operation 816, the SAM solution 331 is applied over the surface of the first ILD layer 320 and the surface of the first metal portion 330, as shown in FIG. 3C. At operation 818, PGME and PGMEA of the SAM solution 331 on the first ILD layer 320 and the first metal portion 330 are vaporized to form a SAM (i.e. the first blocking layer 333) on the first metal portion 330, as shown in FIG. 3D. At operation 820, a metal oxide layer (i.e. the first dielectric layer 340) is selectively deposited on the first ILD layer 320 using the SAM 333 as a stencil, as shown in FIG. 3E. At operation 822, an acid is applied over the SAM 333 and the metal oxide layer 340 to remove the SAM 333 on the first metal portion 330. At operation 824, a second ILD layer 350 is formed on the metal oxide layer 340 and the first metal portion 330, as shown in FIG. 3F. At operation 826, a second opening 352 is formed through the second ILD layer 350 to expose the surface of the first metal portion 330, as shown in FIG. 3G. At operation 828, the second opening 352 is filled with a second metal material, thereby forming a second metal portion 332 electrically connected to the first metal portion 330, as shown in FIG. 3H.

A selective deposition method for forming a semiconductor structure is provided in the embodiments of the present disclosure. The selective deposition method is performed using the SAM solution including the at least one blocking compound and the specific multi-solvent system. The ester and the alcohol are mixed to form the multi-solvent system with a specific dielectric constant. Specific orientation of the at least one blocking compound and sufficient solubility of the at least one blocking compound may be provided by the multi-solvent system. Therefore, the SAM solution provided in the present disclosure may be applied to various semiconductor device fabrication processes, for example, selective deposition of the DoD process, selective deposition of the DoM process and/or selective deposition of the MoM process where different blocking compounds may be applied. The blocking layer formed by the SAM solution has sufficient coverage on the metal portion, and thus the metal portion may remain low resistance after the selective deposition of the dielectric layer beside the metal portion. The selective deposition method is applicable to the method for forming the interconnect structure of the semiconductor structure, as shown in FIG. 3A through FIG. 3H and FIG. 5A through FIG. 5I.

In some embodiments, a method for forming a semiconductor structure is provided. The method includes the following operations. First, a substrate including a metal portion and a low-k dielectric portion formed thereon is provided, in which the metal portion adjoins the low-k dielectric portion. Then, a self-assembled monolayer (SAM) solution is prepared, in which the SAM solution includes at least one blocking compound and a multi-solvent system. The at least one blocking compound is configured to adhere to one of the metal portion and the low-k dielectric portion. The multi-solvent system includes an alcohol and an ester, in which the alcohol has 1 to 6 carbon atoms and the ester has 1 to 6 carbon atoms. Next, the SAM solution is applied over surfaces of the metal portion and the low-k dielectric portion. Thereafter, the substrate is heated to remove the multi-solvent system of the SAM solution over the surfaces of the metal portion and the low-k dielectric portion to form a blocking layer on one of the metal portion and the low-k dielectric portion. Next, a material layer is selectively deposited on the other one of the metal portion and the low-k dielectric portion using the blocking layer as a stencil, in which the material layer includes a metal material or a dielectric material. Then, the blocking layer is removed from the substrate.

According to some embodiments of the present disclosure, preparing the SAM solution includes dispersing the at least one blocking compound in the multi-solvent system including glycol ether and glycol ether ester.

According to some embodiments of the present disclosure, preparing the SAM solution includes dispersing the at least one blocking compound in the multi-solvent system including propylene glycol monomethyl ether (PGME) and propylene glycol monomethyl ether acetate (PGMEA).

According to some embodiments of the present disclosure, preparing the SAM solution includes dispersing the at least one blocking compound in the multi-solvent system with a dielectric constant that is in a range substantially from 10 to 12.

According to some embodiments of the present disclosure, the at least one blocking compound having a tail group including an alkyl chain having 10 to 18 carbon atoms.

According to some embodiments of the present disclosure, the SAM solution further includes an additive, and the additive includes a stabilizer, a surfactant or a dispersant.

According to some embodiments of the present disclosure, preparing the SAM solution includes dispersing the at least one blocking compound in the multi-solvent system containing the alcohol substantially in a range from about 10 weight percent (wt. %) to about 90 wt. % and the ester substantially in a range from about 10 wt. % to about 90 wt. %.

According to some embodiments of the present disclosure, a concentration of the at least one blocking compound in the SAM solution is in a range substantially from 1 mM to 5 mM.

According to some embodiments of the present disclosure, depositing the material layer includes depositing the material layer to a thickness substantially equal to or greater than 50 Å.

According to some embodiments of the present disclosure, when the at least one blocking compound includes at least one of a thiol compound and a phosphonic acid compound, the blocking layer is formed on the metal portion and the material layer is formed on the low-k dielectric portion, and the material layer is formed from the dielectric material.

According to some embodiments of the present disclosure, when the at least one blocking compound includes a silane compound, the blocking layer is formed on the low-k dielectric portion and the material layer is formed on the metal portion.

In some embodiments, a method of forming a semiconductor structure is provided. The method includes the following operations. First, a substrate is provided. Next, a first inter-layer dielectric (ILD) layer is formed on the substrate. Then, a first opening is formed through the first ILD layer to expose a portion of the substrate. Thereafter, the first opening is filled with a first metal material, thereby forming a first metal portion. Then, a SAM solution is prepared. The SAM solution includes at least one blocking compound and a multi-solvent system. The at least one blocking compound is configured to adhere to the first metal portion. The at least one blocking compound includes one or both of a thiol compound and a phosphonic acid compound. A chemical structure of the at least one blocking compound has a head group and a tail group. The multi-solvent system includes an alcohol and an ester, in which the alcohol has 1 to 6 carbon atoms and the ester has 1 to 6 carbon atoms. Then, the SAM solution is applied over a surface of the first metal portion and a surface of the first ILD layer. Thereafter, the substrate is heated to remove the multi-solvent system of the SAM solution over the surface of the first metal portion and the surface of the first ILD layer to form a first blocking layer on the first metal portion. Next, a first dielectric layer is selectively deposited on the first ILD layer using the first blocking layer as a stencil. Then, the first blocking layer on the first metal portion is removed. Thereafter, a second ILD layer is formed on the first dielectric layer and the first metal portion. Then, a second opening is formed through the second ILD layer to expose the surface of the first metal portion. Next, the second opening is filled with a second metal material, thereby forming a second metal portion electrically connected to the first metal portion.

According to some embodiments of the present disclosure, forming the second opening further includes the following operations. A third opening is formed adjacent to the second opening and through the second ILD layer, thereby exposing a portion of the first dielectric layer. The portion of the first dielectric layer is etched, thereby exposing a portion of the first ILD layer. Filling the second opening with the second metal material further includes the following operations. A seed layer is deposited into the second opening and the third opening. The second opening and the third opening are filled with the second metal material, thereby forming the second metal portion and a third metal portion.

According to some embodiments of the present disclosure, after forming the second metal portion and the third metal portion, the method further includes the following operations. The SAM solution is applied over a surface of the second ILD layer, a surface of the second metal portion and a surface of the third metal portion. Then, the substrate is heated to remove the multi-solvent system of the SAM solution over the surface of the second ILD layer, the surface of the second metal portion and the surface of the third metal portion, so as to form a second blocking layer on the second metal portion and the third metal portion. The second blocking layer is formed of the at least one blocking compound. Then, a second dielectric layer is selectively deposited on the second ILD layer using the second blocking layer as a stencil. Next, the second blocking layer on the second metal portion and the third metal portion is removed.

According to some embodiments of the present disclosure, each of depositing the first dielectric layer and depositing the second dielectric layer includes depositing a metal oxide layer.

According to some embodiments of the present disclosure, the method further includes forming a third ILD layer on the second dielectric layer, the second metal portion and the third metal portion. Thereafter, a fourth opening is formed through the third ILD layer to expose the surface of the second metal portion. Next, the fourth opening is filled with a third metal material, thereby forming a fourth metal portion electrically connected to the second metal portion.

According to some embodiments of the present disclosure, each of removing the first blocking layer and removing the second blocking layer includes applying an acid onto the first blocking layer or the second blocking layer, and/or heating the substrate.

In some embodiments, a method of forming a semiconductor structure is provided. The method includes the following operations. First, a substrate is provided. Next, a first inter-layer dielectric (ILD) layer is formed on the substrate. Then, a first opening is formed through the first ILD layer to expose a portion of the substrate. Thereafter, the first opening is filled with a first metal material, thereby forming a first metal portion. Thereafter, a surface of the first metal portion and a surface of the first ILD layer are planarized. Next, the surface of the first metal portion and the surface of the first ILD layer are pre-cleaned. Then, a SAM solution is prepared. The SAM solution includes a phosphonic acid compound configured to adhere to the first metal portion, propylene glycol monomethyl ether (PGME) and propylene glycol monomethyl ether acetate (PGMEA). A mixture of PGME and PGMEA has a dielectric constant in a range substantially from 10 to 12. Next, the SAM solution is applied over the surface of the first ILD layer and the surface of the first metal portion. Then, PGME and PGMEA of the SAM solution on the first ILD layer and the first metal portion are vaporized to form a SAM on the first metal portion. Next, a metal oxide layer is selectively deposited on the first ILD layer using the SAM as a stencil. Then, an acid is applied over the SAM layer and the metal oxide layer to remove the SAM layer on the first metal portion. Next, a second ILD layer is formed on the metal oxide layer and the first metal portion. Then, a second opening is formed through the second ILD layer to expose the surface of the first metal portion. Thereafter, the second opening is filled with a second metal material, thereby forming a second metal portion. The second metal portion is electrically connected to the first metal portion.

According to some embodiments of the present disclosure, preparing the SAM solution includes dissolving the phosphonic acid compound in PGMEA having a concentration not greater than about 90 wt. %.

According to some embodiments of the present disclosure, applying the acid over the SAM layer and the metal oxide layer includes applying acetic acid over the SAM layer and the metal oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, the method comprising:
   providing a substrate including a metal portion and a low-k dielectric portion formed thereon, wherein the metal portion adjoins the low-k dielectric portion;
   preparing a self-assembled monolayer (SAM) solution comprising:
      at least one blocking compound configured to adhere to one of the metal portion and the low-k dielectric portion; and
      a multi-solvent system comprising an alcohol and an ester, wherein the alcohol has 1 to 6 carbon atoms and the ester has 1 to 6 carbon atoms;
   applying the self-assembled monolayer (SAM) solution over surfaces of the metal portion and the low-k dielectric portion;
   heating the substrate to remove the multi-solvent system of the self-assembled monolayer (SAM) solution over the surfaces of the metal portion and the low-k dielectric portion to form a blocking layer on one of the metal portion and the low-k dielectric portion;
   selectively depositing a material layer on the other one of the metal portion and the low-k dielectric portion using the blocking layer as a stencil, wherein the material layer comprises a metal material or a dielectric material; and
   removing the blocking layer from the substrate.

2. The method of claim 1, wherein preparing the self-assembled monolayer (SAM) solution comprises dispersing the at least one blocking compound in the multi-solvent system comprising glycol ether and glycol ether ester.

3. The method of claim 1, wherein preparing the self-assembled monolayer (SAM) solution comprises dispersing the at least one blocking compound in the multi-solvent system comprising propylene glycol monomethyl ether (PGME) and propylene glycol monomethyl ether acetate (PGMEA).

4. The method of claim 1, wherein preparing the self-assembled monolayer (SAM) solution comprises dispersing the at least one blocking compound in the multi-solvent system with a dielectric constant that is in a range substantially from 10 to 12.

5. The method of claim 1, wherein the at least one blocking compound comprises a tail group comprising an alkyl chain having 10 to 18 carbon atoms.

6. The method of claim 1, wherein the self-assembled monolayer (SAM) solution further comprises an additive, and the additive comprises a stabilizer, a surfactant or a dispersant.

7. The method of claim 1, wherein preparing the self-assembled monolayer (SAM) solution comprises dispersing the at least one blocking compound in the multi-solvent system containing the alcohol substantially in a range from about 10 weight percent (wt. %) to about 90 wt. % and the ester substantially in a range from about 10 wt. % to about 90 wt. %.

8. The method of claim 1, wherein a concentration of the at least one blocking compound in the self-assembled monolayer (SAM) solution is in a range substantially from 1 mM to 5 mM.

9. The method of claim 1, wherein depositing the material layer comprises depositing the material layer to a thickness substantially equal to or greater than 50 Å.

10. The method of claim 1, wherein when the at least one blocking compound comprises at least one of a thiol compound and a phosphonic acid compound, the blocking layer is formed on the metal portion and the material layer is formed on the low-k dielectric portion, and the material layer is formed from the dielectric material.

11. The method of claim 1, wherein when the at least one blocking compound comprises a silane compound, the blocking layer is formed on the low-k dielectric portion and the material layer is formed on the metal portion.

12. A method of forming a semiconductor structure, the method comprising:
providing a substrate;
forming a first inter-layer dielectric (ILD) layer on the substrate;
forming a first opening through the first inter-layer dielectric (ILD) layer to expose a portion of the substrate;
filling the first opening with a first metal material, thereby forming a first metal portion;
preparing a self-assembled monolayer (SAM) solution comprising:
at least one blocking compound configured to adhere to the first metal portion, wherein the at least one blocking compound comprises one or both of a thiol compound and a phosphonic acid compound, and a chemical structure of the at least one of blocking compound has a head group and a tail group; and
a multi-solvent system comprising an alcohol and an ester, wherein the alcohol has 1 to 6 carbon atoms and the ester has 1 to 6 carbon atoms;
applying the self-assembled monolayer (SAM) solution over a surface of the first metal portion and a surface of the first inter-layer dielectric (ILD) layer;
heating the substrate to remove the multi-solvent system of the self-assembled monolayer (SAM) solution over the surface of the first metal portion and the surface of the first inter-layer dielectric (ILD) layer to form a first blocking layer on the first metal portion;
selectively depositing a first dielectric layer on the first inter-layer dielectric (ILD) layer using the first blocking layer as a stencil;
removing the first blocking layer on the first metal portion;
forming a second inter-layer dielectric (ILD) layer on the first dielectric layer and the first metal portion;
forming a second opening through the second inter-layer dielectric (ILD) layer to expose the surface of the first metal portion; and
filling the second opening with a second metal material, thereby forming a second metal portion electrically connected to the first metal portion.

13. The method of claim 12, wherein forming the second opening further comprises:
forming a third opening adjacent to the second opening and through the second inter-layer dielectric (ILD) layer, thereby exposing a portion of the first dielectric layer;
etching the portion of the first dielectric layer, thereby exposing a portion of the first inter-layer dielectric (ILD) layer; and
forming a third metal portion in the third opening.

14. The method of claim 13, wherein after forming the second metal portion and the third metal portion, the method further comprises:
applying the self-assembled monolayer (SAM) solution over a surface of the second inter-layer dielectric (ILD) layer, a surface of the second metal portion and a surface of the third metal portion;
heating the substrate to remove the multi-solvent system of the self-assembled monolayer (SAM) solution over the surface of the second inter-layer dielectric (ILD) layer, the surface of the second metal portion and the surface of the third metal portion, so as to form a second blocking layer on the second metal portion and the third metal portion, wherein the second blocking layer is formed of the at least one blocking compound;
selectively depositing a second dielectric layer on the second inter-layer dielectric (ILD) layer using the second blocking layer as a stencil; and
removing the second blocking layer on the second metal portion and the third metal portion.

15. The method of claim 14, wherein each of depositing the first dielectric layer and depositing the second dielectric layer comprises depositing a metal oxide layer on the first inter-layer dielectric (ILD) layer or the second inter-layer dielectric (ILD) layer.

16. The method of claim 14, further comprising:
forming a third inter-layer dielectric (ILD) layer on the second dielectric layer, the second metal portion and the third metal portion;
forming a fourth opening through the third inter-layer dielectric (ILD) layer to expose the surface of the second metal portion; and
filling the fourth opening with a third metal material, thereby forming a fourth metal portion electrically connected to the second metal portion.

17. The method of claim 14, wherein each of removing the first blocking layer and removing the second blocking layer comprises:
applying an acid onto the first blocking layer or the second blocking layer; and/or
heating the substrate.

18. A method of forming a semiconductor structure, the method comprising:
providing a substrate;
forming a first inter-layer dielectric (ILD) layer on the substrate;
forming a first opening through the first inter-layer dielectric (ILD) layer to expose a portion of the substrate;
filling the first opening with a first metal material, thereby forming a first metal portion;
planarizing a surface of the first metal portion and a surface of the first inter-layer dielectric (ILD) layer;
pre-cleaning the surface of the first metal portion and the surface of the first inter-layer dielectric (ILD) layer;
preparing a self-assembled monolayer (SAM) solution comprising:
a phosphonic acid compound configured to adhere to the first metal portion;
propylene glycol monomethyl ether (PGME); and
propylene glycol monomethyl ether acetate (PGMEA), wherein a mixture of the propylene glycol monomethyl ether (PGME) and the propylene glycol monomethyl ether acetate (PGMEA) has a dielectric constant that is in a range substantially from 10 to 12;
applying the self-assembled monolayer (SAM) solution over the surface of the first inter-layer dielectric (ILD) layer and the surface of the first metal portion;
vaporizing the propylene glycol monomethyl ether (PGME) and the propylene glycol monomethyl ether acetate (PGMEA) of the self-assembled monolayer (SAM) solution on the first inter-layer dielectric (ILD) layer and the first metal portion to form a self-assembled monolayer (SAM) layer on the first metal portion;

selectively depositing a metal oxide layer on the first inter-layer dielectric (ILD) layer by using the self-assembled monolayer (SAM) layer as a stencil;

applying an acid over the self-assembled monolayer (SAM) layer and the metal oxide layer to remove the self-assembled monolayer (SAM) layer on the first metal portion;

forming a second inter-layer dielectric (ILD) layer on the metal oxide layer and the first metal portion;

forming a second opening through the second inter-layer dielectric (ILD) layer to expose the surface of the first metal portion; and filling the second opening with a second metal material, thereby forming a second metal portion, wherein the second metal portion is electrically connected to the first metal portion.

19. The method of claim 18, wherein preparing the self-assembled monolayer (SAM) solution comprises dissolving the phosphonic acid compound in propylene glycol monomethyl ether acetate (PGMEA) having a concentration not greater than about 90 wt. %.

20. The method of claim 18, wherein applying the acid over the self-assembled monolayer (SAM) layer and the metal oxide layer comprises applying acetic acid over the self-assembled monolayer (SAM) layer and the metal oxide layer.

* * * * *